US006640431B1

(12) United States Patent
Yoriki et al.

(10) Patent No.: US 6,640,431 B1
(45) Date of Patent: Nov. 4, 2003

(54) ELECTRIC-COMPONENT MOUNTING APPARATUS AND ELECTRIC-COMPONENT MOUNTING METHOD

(75) Inventors: Minoru Yoriki, Chiryu (JP); Mitsuo Imai, Okazaki (JP); Jiro Kodama, Nagoya (JP); Kimihiko Yasuda, Anjo (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/501,664

(22) Filed: Feb. 10, 2000

(30) Foreign Application Priority Data

Feb. 24, 1999 (JP) .......................................... 11-046602

(51) Int. Cl.⁷ .................................................. H05K 3/30
(52) U.S. Cl. ............................. 29/834; 29/703; 29/712; 29/740; 29/742; 29/743; 29/759; 29/760; 29/833; 294/2; 294/64.1; 414/737; 414/752
(58) Field of Search .......................... 29/703, 712, 740, 29/742, 743, 759, 760, 833, 834; 294/2, 64.1; 414/737, 752; 901/40

(56) References Cited

U.S. PATENT DOCUMENTS

| 4,794,689 A | * | 1/1989 | Seno | 29/740 |
| 5,867,897 A | * | 2/1999 | Mimura | 29/840 |
| 6,041,494 A | * | 3/2000 | Mimura et al. | 29/832 |
| 6,094,808 A | * | 8/2000 | Mimura | 29/743 |
| 6,161,277 A | * | 12/2000 | Asai | 29/740 |
| 6,263,559 B1 | * | 7/2001 | Mimura | 29/721 |

FOREIGN PATENT DOCUMENTS

| EP | 0-851-728 A1 | 7/1998 |
| JP | 5-235596 | 9/1993 |
| JP | 6-342998 | 12/1994 |
| JP | 10-163689 | 6/1998 |

* cited by examiner

*Primary Examiner*—Peter Vo
*Assistant Examiner*—Paul D Kim
(74) *Attorney, Agent, or Firm*—Oliff & Berridge, PLC

(57) ABSTRACT

An apparatus for moving an operative suction nozzle which holds an electric component. The apparatus mounts the electric component held by the operative suction nozzle on a circuit board. The apparatus includes a device which supplies the electric component to the operative suction nozzle; a device which supports the circuit substrate; a nozzle storing device which stores normal suction nozzles; and a nozzle moving device. A nozzle-defect detecting device which detects a defeat of the operative suction nozzle is provided. Also provided is a nozzle exchanging device which automatically operates the nozzle moving device to move the defective suction nozzle having the detected defect, to the nozzle storing device so that the defective suction nozzle is exchanged with the normal suction nozzle stored by the nozzle storing device.

36 Claims, 19 Drawing Sheets

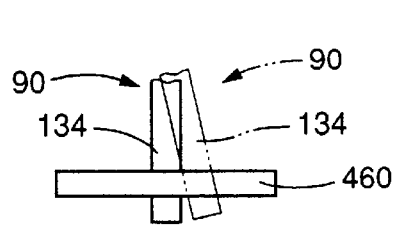
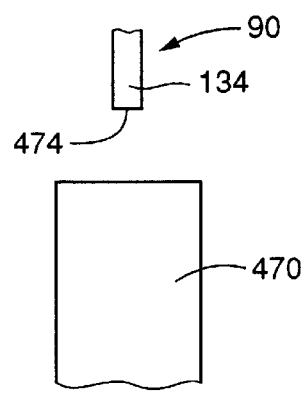
FIG. 18      FIG. 19
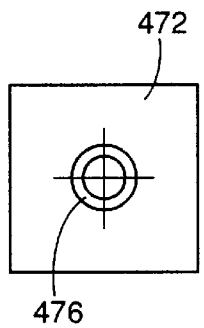
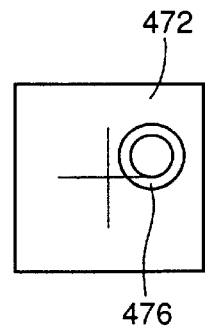
FIG. 20A      FIG. 20B
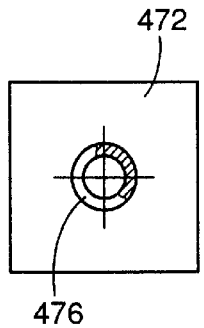
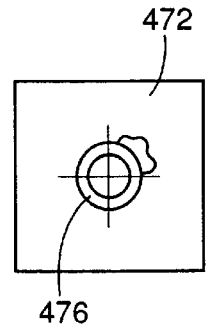
FIG. 20C      FIG. 20D

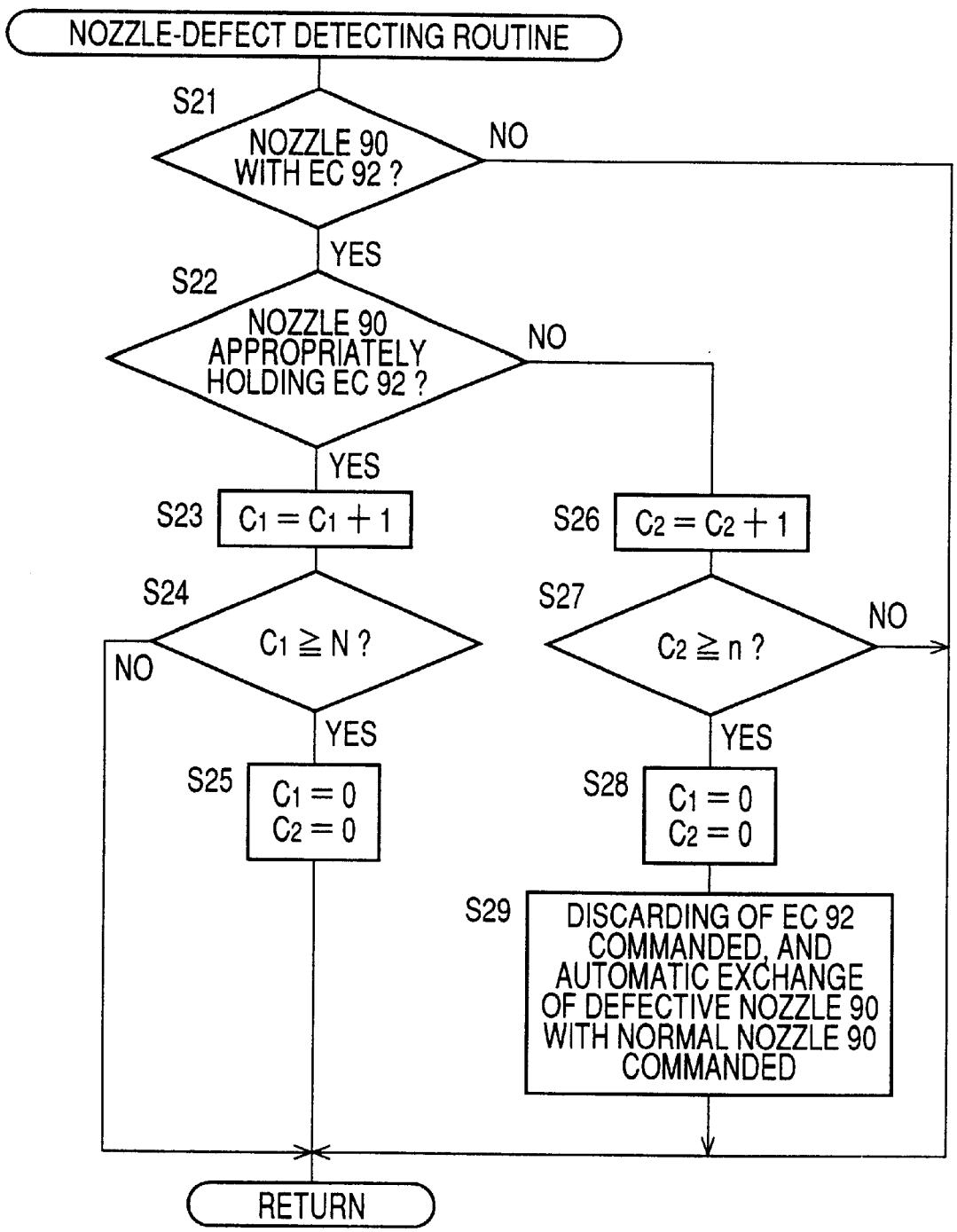

ELECTRIC-COMPONENT MOUNTING APPARATUS AND ELECTRIC-COMPONENT MOUNTING METHOD

BACKGROUND OF THE INVENTION

1. Field of the Invention

The present invention relates to electric-component mounting apparatus and method for moving a suction nozzle holding, by suction, an electric component, and mounting, on a circuit substrate such as a printed circuit board, the electric component held by the suction nozzle, and particularly to the art of handling a defective suction nozzle.

2. Related Art Statement

This sort of electric-component ("EC") mounting apparatus is disclosed in, e.g., U.S. patent application Ser. No. 08/977,662 now U.S. Pat. No. 6,161,277 assigned to the assignee of the present application. The disclosed mounting apparatus includes a movable member; a rotatable body which is rotatably supported by the movable member; and a plurality of suction nozzles which are supported by the rotatable body. When the movable member is moved, respective electric components ("ECs") held by the suction nozzles are simultaneously transferred, and when the rotatable body is rotated, the suction nozzles are sequentially moved to an EC-mount position where each of the suction nozzles mounts, on a circuit substrate ("CS"), the EC held thereby.

The above-identified EC mounting apparatus iteratively holds and transfers ECs and mounts the ECs on CSs. Accordingly, in an EC mounting operation, one or more of the suction nozzles may become defective, for example, may be bent or curved, be stained, or be worn, and may fail to hold or mount an EC. Conventionally, each defective suction nozzle is manually exchanged with a normal suction nozzle by an operator. However, the nozzle exchange is cumbersome and time-consuming. Since the EC mounting operation is suspended by the nozzle exchange, the EC mounting efficiency is lowered.

SUMMARY OF THE INVENTION

The present invention provides an electric-component mounting apparatus and an electric-component mounting method which have one or more of the technical features that are described below in respective paragraphs given parenthesized sequential numbers (1) to (25). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the combinations thereof are just examples to which the present invention is by no means limited. Rather, the concept of the present invention should be construed based on the entire description of the specification and the drawings.

(1) According to a first feature of the present invention, there is provided an apparatus for moving at least one suction nozzle holding, by suction, an electric component, and mounting, on a circuit substrate, the component held by the nozzle, the apparatus comprising a nozzle-defect detecting device which detects a defect of the suction nozzle; and a nozzle exchanging device which automatically exchanges the defective suction nozzle having the detected defect, with a normal suction nozzle. The present electric-component ("EC") mounting apparatus may be one which includes only one suction nozzle, or one which includes a plurality of suction nozzles. The at least one suction nozzle may be moved by a movable member which is movable to an arbitrary position on a plane, or may be rotated by a rotatable body which is rotatable about an axis line. When the nozzle-defect detecting device automatically detects a defect of the suction nozzle, the nozzle exchanging device automatically exchanges the defective suction nozzle having the defect, with a normal suction nozzle. Thus, the present EC mounting apparatus exchanges the suction nozzles more quickly than an operator does with his or her hands. Although the EC mounting operation may be suspended by the nozzle exchange, the decrease of the EC mounting efficiency is minimized. In addition, since the EC mounting apparatus needs no intervention of the operator for performing the nozzle exchange and can full-automatically perform the EC mounting operation, the operator need not do the nozzle exchange and can do another task. Thus, the working efficiency of the operator is increased.

(2) According to a second feature of the present invention that includes the first feature (1), the mounting apparatus further comprises a nozzle-exchanging-device control device which controls, when the nozzle-defect detecting device detects the defective suction nozzle, the nozzle exchanging device to exchange the defective suction nozzle with the normal suction nozzle, while suspending an electric-component mounting operation which is continuously performed when the nozzle-defect detecting device does not detect the defective suction nozzle. The electric-component ("EC") mounting operation means, for example, mounting a plurality of ECs on a single circuit substrate ("CS"), mounting a single EC on each of a plurality of CSs, or mounting a plurality of ECs on each of a plurality of CSs. In the case where the present EC mounting apparatus is one which can mount ECs in each of a plurality of different mounting manners, the EC mounting operation means mounting ECs in each of the different mounting manners. For example, as will be explained in DETAILED DESCRIPTION OF THE PREFERRED EMBODIMENTS, in the case where two EC mounting apparatuses take ECs from respective exclusive EC supplying devices, and cooperate with each other to produce an electric circuit by alternately mounting the ECs on a CS, an EC mounting system including the two EC mounting apparatuses may be used in a first mounting manner in which the two EC supplying devices are used to mount ECs on a certain single sort of CSs and include same sorts of EC-supply feeders and all the EC-supply feeders of the two supplying devices are used to mount ECs on each of a plurality of CSs of the single sort. Alternatively, the EC mounting system including the two mounting apparatuses may be used in a second mounting manner in which each of the two EC supplying devices include EC-supply feeders needed to mount ECs on two sorts of CSs and the EC-supply feeders of the two supplying devices are used to mount continuously ECs on each of a plurality of CSs of the two sorts without needing any exchanges of the EC-supply feeders. The EC mounting operation includes all steps that are carried out, for mounting ECs, by the EC mounting apparatuses from the start to the end. Thus, the EC mounting operation includes, in addition to the step of mounting ECs on a CS, the step of sucking and holding the ECs, the step of moving the suction nozzles between the EC supplying devices and the CS, and may additionally include a waiting step in which the EC mounting apparatuses just wait without doing anything. Thus, the nozzle exchange may be performed in the EC mounting operation, for example, in the EC-mounting step, the EC-sucking-and-holding step, the nozzle-moving step, or the waiting step. If the nozzle exchange is performed in the EC-mounting step, the EC-sucking-and-holding step, or the nozzle-moving step, each step is temporarily suspended, and after the exchange, it is resumed. In the waiting step, the nozzle exchange can be performed without suspending any of the above-indicated steps. Since the defective suction nozzle is exchanged with the normal suction nozzle in the EC mounting operation, the present EC mounting apparatus can continue to mount the ECs on the CS with the normal suction nozzle. This contributes to lowering the decrease of the EC mounting efficiency. For example, in the case where the present EC mounting apparatus includes a plurality of suction nozzles and does not use one or more defective suction nozzles to mount ECs on a CS, the number of the suction nozzles that can be used to mount the ECs is decreased by the number of the defective suction nozzles, which leads to lowering the EC mounting efficiency. However, after the defective nozzle or nozzles is/are exchanged with the normal nozzle or nozzles, the present apparatus can mount the ECs on the CS with the pre-programmed (i.e., maximum) number of nozzles. In the case where the present apparatus includes only a single suction nozzle, an EC mounting operation is suspended if the suction nozzle becomes defective. However, since the present apparatus can quickly exchange the defective nozzle with a normal one, it can minimize the suspension time and accordingly the decrease of the EC mounting efficiency. In the case where the EC mounting operation includes a time duration in which the EC mounting apparatus does not mount any ECs, it is preferred that the defective nozzle be exchanged with a normal nozzle in that time duration, because the EC-mounting step need not be suspended for the nozzle exchange. For example, in the case where the present apparatus is designed to mount ECs successively on each of a plurality of CSs, and does not mount any ECs in a time duration after it has mounted all ECs on one CS and before the one CS is replaced with the next CS, the defective nozzle may be exchanged with a normal one in that time duration. Otherwise, when the current sort of CSs on which ECs are currently mounted are changed to another sort of CSs and, in an adjustment time duration, various devices of the present EC mounting apparatus are adjusted to correspond to the new sort of CSs, for example, the CS-position-and-support width of a CS positioning and supporting device for positioning and supporting each CS is adjusted to correspond to the width of the new sort of CSs, the defective nozzle may be exchanged with a normal one in the adjustment time duration. In the case where a plurality of ECs are mounted on a single CS, for example, two EC mounting heads alternately mount ECs on a CS as will be described in DETAILED DESCRIPTION OF PREFERRED EMBODIMENTS, one of the two mounting heads may take a longer time to mount ECs on a CS than a time taken by the other mounting head to take ECs from a corresponding EC supplying device. In this case, while the other mounting head is taking ECs from the corresponding EC supplying device, the defective nozzle of the one mounting head may be exchanged with a normal one by using a time difference of the above-indicated longer and shorter times. In the last case, too, the decrease of the EC mounting efficiency can be minimized.

(3) According to a third feature of the present invention that includes the second feature (2), the mounting apparatus is for mounting a plurality of electric components on the circuit substrate, and the nozzle-exchanging-device control device controls the nozzle exchanging device to exchange the defective suction nozzle with the normal suction nozzle, while suspending the electric-component mounting operation in which the electric components are mounted on the circuit substrate. Alternatively, the defective suction nozzle may be exchanged with the normal suction nozzle, after all the ECs have been mounted on the CS. However, the present apparatus exchanges the defective nozzle with the normal nozzle, while suspending the EC mounting operation. After the exchange, the present apparatus can mount ECs without the defective nozzle, which contributes to minimizing the decrease of the EC mounting efficiency.

(4) According to a fourth feature of the present invention that includes the first feature (1), the mounting apparatus is for mounting a plurality of electric components on the circuit substrate, and at least one of the nozzle-defect detecting device and the nozzle exchanging device is operated in the electric-component mounting operation in which the electric, components are mounted on the circuit substrate. In the case where both of the nozzle-defect detecting device and the nozzle exchanging device are operated in the EC mounting operation, the present EC mounting apparatus can mount, after the nozzle exchange, ECs on a CS without the defective nozzle, which leads to minimizing the decrease of the EC mounting efficiency. In the case where only the nozzle-defect detecting device is operated in the EC mounting operation, the present apparatus can perform the nozzle exchange immediately after the EC mounting operation. And, in the case where only the nozzle exchanging device is operated in the EC mounting operation, the present apparatus can mount, after the nozzle exchange, ECs on a CS without lowering the EC mounting efficiency.

(5) According to a fifth feature of the present invention that includes any one of the first to fourth features (1) to (4), the mounting apparatus further comprises a judging device which judges, when the nozzle-defecting device detects the defective suction nozzle, whether it is needed to exchange the defective suction nozzle with the normal suction nozzle to prevent the defective suction nozzle from holding, by suction, any other electric component. Depending upon, e,g., different sorts and/or degrees of defects, it may, or may not, be needed to exchange the defective suction nozzle with a normal one so as to prevent the defective nozzle from holding any other or additional EC. For example, in the case where the suction nozzle is broken, it is needed to exchange the defect suction nozzle immediately; and in the case where the suction nozzle is curved, stained, or worn, it is not needed to exchange the defect suction nozzle immediately, if the amount of curving, staining, or wearing of the nozzle is too small to affect adversely the EC mounting function of the nozzle. Thus, the judging device judges whether there is a need to exchange the defective nozzle immediately. If not, the nozzle exchanging device may not exchange the defective nozzle with a normal one immediately. In the last case, one or more useless nozzle exchanges can be avoided, which leads to avoiding the decrease of the EC mounting efficiency. In addition, since the time period in which the suction nozzle is used is more or less increased, the running cost of the present apparatus is decreased as such.

(6) According to a sixth feature of the present invention that includes any one of the first to fifth features (1) to (5), the mounting apparatus further comprises a movable member which supports a plurality of suction nozzles which hold, by suction, respective electric components, so that when the movable member is moved, the electric components held by the suction nozzles are simultaneously transferred with the movable member. The movable member may be provided in one of various forms. For example, the movable member may be one which is movable in at least one of two directions which are perpendicular to each other on a reference plane. The movable member may be movable along a straight line, a curved line, or a combination thereof. The plurality of suction nozzles may be directly supported by the movable member, or may be indirectly supported by the movable member via a rotatable body according to the seventh feature (7) that will be described below. Since the movable member simultaneously transfers the plurality of electric components, the movable member is moved between the CS and the EC supplying device less frequently than the case where the movable member supports only one suction nozzle and fetches only one EC from the EC supplying device to mount the one EC on the CS at each time. Thus, this feature contributes to improving the EC mounting efficiency. When one of the plurality of suction nozzles supported by the movable member becomes defective, the present EC mounting apparatus need not immediately exchange the defective nozzle with a normal one. However, if the defective nozzle is exchanged quickly, the total number of movements of the movable member needed to mount all ECs on each CS can be decreased, which leads to minimizing the decrease of the EC mounting efficiency caused by the occurrence of the defective nozzle.

(7) According to a seventh feature of the present invention that includes the sixth feature (6), the movable member comprises a rotatable member which is rotatable about an axis line and which supports the suction nozzles around the axis line, and the rotatable member is moved, and then is rotated to sequentially position each of the suction nozzles at a component-mount position where the each suction nozzle mounts, on the circuit substrate, the electric component held thereby. The axis line may be perpendicular to, parallel to, or inclined relative to, an EC-transfer plane including an EC-transfer route along which the movable member is moved. The rotatable body may be an intermittent-rotation body which is intermittently rotatable in one direction; an intermittent-rotation body which is intermittently rotatable in each of opposite directions; or a rotatably body which is rotatable by an arbitrary angle in an arbitrary direction. The component-mount position may coincide with a component-suck position where each suction nozzle sucks and holds an EC supplied by the EC supplying device, or may differ from the component-suck position.

(8) According to an eighth feature of the present invention that includes any one of the first to seventh features (1) to (7), the nozzle-defect detecting device comprises an image taking device which takes an image of at least a portion of the suction nozzle; and an image processing device which processes image data representing the image taken by the image taking device, and judges whether the suction nozzle has the defect. The image taking device may be one which takes an image of a suction surface defined by a free end surface of the suction nozzle, while facing the suction surface in a direction substantially parallel to an axis line of the nozzle, or one which takes an image of the entire nozzle while facing the nozzle in a direction intersecting the axis line thereof. The image taking device may be provided by a surface-image taking device which can take a surface image of the suction nozzle at once, or by a so-called "line sensor". The surface-image taking device may include a matrix of CCDs (charge-coupled devices) as image taking elements that cooperate with one another to define an image-take surface on which an image is formed. The line sensor may an array of CCDs as image taking elements. In the case where the surface-image taking device takes an image of, e.g., the suction surface defined by the free end surface of the suction nozzle, the image processing device can recognize curving, breaking, wearing, etc. of the suction nozzle. In the case where the line sensor takes an image of the suction nozzle while facing the nozzle in a direction intersecting an axis line thereof, the image processing device can recognize curving or breaking of the nozzle.

(9) According to a ninth feature of the present invention that includes the eighth feature (8), the nozzle-defect detecting device further comprises a defect-detect moving device which moves at least one of the suction nozzle and the image taking device relative to the other of the suction nozzle and the image taking device. The defect-detect moving device moves the suction nozzle and the image taking device relative to each other, for the purpose of detecting a defect of the suction nozzle, or positioning the suction nozzle at an image-take position. For example, in the case where the line sensor is employed as the image taking device, the image processing device can obtain a two-dimensional image of the nozzle by moving the nozzle and the line sensor relative to each other, and can recognize how the nozzle as a whole is curved.

(10) According to a tenth feature of the present invention that includes any one of the first to ninth features (1) to (9), the nozzle-defect detecting device comprises a beam emitting device which emits a light beam in a direction intersecting an axis line of the suction nozzle; and a beam detecting device which detects the light beam which has been emitted by the beam emitting device and has been affected by the suction nozzle. The light beam may be a common light having a wide spectrum. However, in the case where the light beam is a laser beam, the nozzle-defect detecting device can improve its resolution. In the case where the beam emitting device is provided by an LED (light emitting diode), the LED emits, as the light beam, a multi-color light having a wide spectrum. In the case where the beam emitting device is provided by a laser-beam emitting device, the laser beam is a mono-color light having a narrow spectrum. The light beam affected by the suction nozzle may be a light beam reflected by the nozzle, or a light beam which has passed around the nozzle. The beam emitting and detecting devices may be provided by a transmission-type or reflection-type photoelectric sensor that includes a light source, a light emitter, and a light receiver including a light detecting element. In the case of the transmission-type photoelectric sensor, the light receiver receives, as the light beam affected by the suction nozzle, the light beam which has passed around the nozzle. In the case of the reflection-type photoelectric sensor, the light receiver receives, as the light beam affected by the suction nozzle, the light beam which has been reflected by the nozzle.

(11) According to an eleventh feature of the present invention that includes the tenth feature (10), the nozzle-defect detecting device further comprises a defect-detect moving device which moves at least one of the suction nozzle and a combination of the beam emitting device and the beam detecting device to the other of the suction nozzle and the combination. The defect-detect moving device moves the suction nozzle and the beam emitting and detecting devices relative to each other, for the purpose of detecting a defect of the suction nozzle, or positioning the suction nozzle at an image-take position. In the case where the nozzle and the beam emitting and detecting devices are moved, for detecting a defect of the nozzle, relative to each other, e.g., in a direction having a component intersecting an axis line of the nozzle, the nozzle-defect detecting device can detect curving of the nozzle irrespective of whichever diameter the nozzle may have, because the curved nozzle affects the light beam at a timing different than that at which a normal nozzle does.

(12) According to a twelfth feature of the present invention that includes the ninth or eleventh feature (9) or (11), the defect-detect moving device comprises a nozzle moving device which moves the suction nozzle in a direction having at least one of a first direction component intersecting an axis line of the suction nozzle and a second direction component parallel to the axis line. As described above in connection with the eleventh feature (11), if the suction nozzle is moved in a direction having a component intersecting the axis line of the nozzle, the nozzle-defect detecting device can detect curving of the nozzle irrespective of the diameter of the nozzle. Likewise, if the suction nozzle is moved in a direction having a component parallel to the axis line of the nozzle, the nozzle-defect detecting device can detect curving or breaking of the nozzle, based on a timing at which the light beam is affected by the nozzle. At least a portion of the defect-detect moving device of a type that moves the suction nozzle in a direction having a component intersecting the axis line of the nozzle, may be commonly shared by an EC-transfer moving device which moves the nozzle to transfer the EC held thereby, or may be provided by an exclusive or independent moving device. As will be explained in DETAILED DESCRIPTION OF THE PREFERRED EMBODIMENTS, the section nozzle may be elevated and lowered, for mounting the EC on the CS, by an elevating and lowering device in a direction parallel to the axis line of the nozzle. In this case, the defect-detect moving device may be provided by the elevating and lowering device.

(13) According to a thirteenth feature of the present invention that includes any one of the ninth, eleventh, and twelfth features (9), (11), and (12), the defect-detect moving device comprises a nozzle rotating device which rotates the suction nozzle about an axis line thereof. Since the suction nozzle is rotated, the nozzle can be viewed in a plurality of directions on a reference plane intersecting the axis line of the nozzle, so that a defect of the nozzle can be detected with reliability. For example, if the nozzle is curved in a direction parallel to a direction in which the light beam is emitted and the curved nozzle is located on a plane including the path of travelling of the beam, it is difficult to judge whether the nozzle is curved or not. However, when the curved nozzle is rotated, the nozzle will be deviated from that plane at some angular phase, so that the curving of the nozzle can be detected. As will be described in DETAILED DESCRIPTION OF THE PREFERRED EMBODIMENTS, the present EC mounting apparatus may employ a nozzle rotating device which rotates a suction nozzle about its axis line to change the current rotation position of an EC held thereby, and/or correct a rotation-position error of the EC. In this case, the thus employed nozzle rotating device may provide the nozzle rotating device of the defect-detect moving device. In the last case, the nozzle-defect detecting device may detect a defect of the nozzle, either while the nozzle is rotated to change the current rotation position of the EC and/or correct the rotation-position error of the EC, or while the nozzle is rotated for this particular purpose independent of changing of the current rotation position of the EC and/or correcting of the rotation-position error of the EC.

(14) According to a fourteenth feature of the present invention that includes any one of the first to thirteenth features (1) to (13), the nozzle-defect detecting device comprises a failure detecting device which detects a failure of the suction nozzle to hold, by suction, an electric component; and a judging device which judges, based on the detected failure, whether the suction nozzle has the defect. If the suction nozzle has a defect, the nozzle may fail to hold an EC, for example, it does not hold an EC when it should do, or it holds an EC which, however, has an inappropriate posture in which the EC cannot be mounted. Thus, a defect of the nozzle can be detected by detecting a failure of the nozzle to hold an EC. A failure of the nozzle to hold an EC can be detected in various manners. For example, if the nozzle fails to hold an EC when it should do, a much more amount of air flows into the nozzle without the EC than the amount of air that would flow into the nozzle with the EC. Therefore, upon occurrence of a failure, for example, a negative pressure in a suction passage of the nozzle is weakened, or a vacuum pump is operated at an increased speed to maintain the negative pressure of the suction passage at a predetermined value. Thus, the failure detecting device can detect the failure. Otherwise, the failure detecting device may employ an image taking device which takes an image of an EC held by the nozzle. In this case, the failure detecting device can detect a failure of the nozzle based on the taken image. As will be described in DETAILED DESCRIPTION OF THE PREFERRED EMBODIMENTS, the present EC mounting apparatus may employ an image taking device which takes an image of an EC held by a suction nozzle, for the purpose of mounting the EC in an appropriate posture on a CS. In this case, the thus employed image taking device may provide the image taking device of the failure detecting device. Alternatively, the failure detecting device may employ an image taking device which is exclusively used to detect a failure of the nozzle to hold an EC.

(15) According to a fifteenth feature of the present invention that includes the fourteenth feature (14), the judging device comprises a static-analysis device which statistically analyzes a plurality of failures detected by the failure detecting device, and judges, based on the static analysis of the static-analysis device, whether the suction nozzle has the defect. The present failure detecting device detects a plurality of failures of the suction nozzle to hold a plurality of ECs, the static-analysis device statistically analyzes the detected failures, and the judging device judges, based on the static analysis of the static-analysis device, whether the suction nozzle has a defect. Thus, the judging device can make a positive or negative judgement with high reliability.

(16) According to a sixteenth feature of the present invention that includes any one of the first to fifteenth features (1) to (15), the nozzle exchanging device comprises a nozzle storing device which stores a plurality of suction nozzles such that each one of the suction nozzles is removable therefrom independent of the other suction nozzles; and a nozzle-exchange moving device which performs a nozzle-exchange movement including a combination of a first relative movement of the each suction nozzle and the nozzle storing device in a direction parallel to an axis line of the each suction nozzle and a second relative movement of the each suction nozzle and the nozzle storing device in a direction perpendicular to the axis line. It is preferred that at least a portion of the nozzle-exchange moving device be commonly shared by the defect-detect moving device according to the twelfth feature (12). Alternatively, at least a portion of the nozzle-exchange moving device be commonly shared by an EC-transfer moving device which moves the suction nozzle to transfer the EC held by the nozzle. It is possible that the nozzle-exchange moving device, the defect-detect moving device, and the EC-transfer moving device share at least a portion thereof. In the last case, the EC mounting apparatus can enjoy a simple construction.

(17) According to a seventeenth feature of the present invention that includes the sixteenth feature (16), the nozzle exchanging device further comprises a nozzle holder which holds the suction nozzle in a state in which the nozzle holder permits the suction nozzle to be removed therefrom when being drawn with a force having a direction toward a free end thereof and a magnitude greater than a reference value; and a permitting and inhibiting device which is supported by the nozzle storing device and which is selectively placed in a permitting state in which the permitting and inhibiting device permits the suction nozzle held by the nozzle holder to be stored by the nozzle storing device by being moved in one of opposite directions parallel to an axis line of the suction nozzle and permits each of the suction nozzles stored by the nozzle storing device to be removed from the nozzle storing device by being moved in the other direction, and an inhibiting state in which the permitting and inhibiting device inhibits the suction nozzle held by the nozzle holder from being stored by the nozzle storing device by being moved in the one direction and inhibits the each suction nozzle stored by the nozzle storing device from being removed from the nozzle storing device by being moved in the other direction. In the state in which the permitting and inhibiting device is placed in the inhibiting state, each suction nozzle is inhibited from being removed from the nozzle storing device; but in the state in which the permitting and inhibiting device is placed in the permitting state, each suction nozzle can be easily removed from the nozzle storing device. When the suction nozzle held by the nozzle holder is drawn with a force having a magnitude greater than a reference value in a direction parallel to the axis line of the nozzle, the nozzle can be easily removed from the holder.

(18) According to an eighteenth feature of the present invention that includes the seventeenth feature (17), each of the suction nozzle held by the nozzle holder and the suction nozzles stored by the nozzle storing device includes a holdable portion which can be held by the nozzle holder, and a shoulder surface facing toward a side of the holdable portion, and the nozzle storing device comprises a nozzle storing member, a nozzle-removal inhibiting member, and a nozzle-removal-inhibiting-member moving device, the nozzle storing member having a plurality of nozzle storing holes which are formed along a reference plane and each of which can accommodate a free-end-side portion of the each suction nozzle that is located between a free end thereof and the shoulder surface thereof, the nozzle-removal inhibiting member being movable along the reference plane, and having a plurality of through-holes which correspond to the plurality of nozzle storing holes of the nozzle storing member, respectively, and each of which permits the free-end-side portion of the each suction nozzle to be passed therethrough in the opposite directions parallel to the axis line of the each suction nozzle, and a plurality of nozzle-removal inhibiting portions which are adjacent to the plurality of through-holes, respectively, and each of which can engage the shoulder surface of the each suction nozzle to prevent the each suction nozzle from being removed from the nozzle storing member, the nozzle-removal-inhibiting-member moving device moving the nozzle-removal inhibiting member to an operative position thereof where each of the nozzle-removal inhibiting portions can engage the shoulder surface of the each suction nozzle and to an inoperative position thereof where the plurality of through-holes are aligned with the plurality of nozzle storing holes, respectively, the permitting and inhibiting device comprising the nozzle-removal inhibiting member and the nozzle-removal-inhibiting-member moving device. When the suction nozzle held by the nozzle holder is returned to the nozzle storing member, the nozzle-removal inhibiting member is moved to the inoperative position where the inhibiting member permits the nozzle holder to return the suction nozzle held thereby, to the nozzle storing member and permits the nozzle held by the nozzle holder to be held by the storing member as well. Subsequently, the inhibiting member is moved to the operative position where the inhibiting member inhibits the nozzle held by the nozzle holder and the storing member, from being removed from the storing member. Then, when the nozzle holder is moved in a direction away from the storing member, the nozzle is drawn with a force greater than a reference value in a direction in which the nozzle is removed from the holder, so that the nozzle is removed from the holder.

(19) According to a nineteenth feature of the present invention, there is provided an apparatus for performing a series of electric-component mounting operations, the apparatus comprising a mounting device which mounts, according to a prescribed electric-component mounting program, a plurality of electric components on each of a plurality of circuit substrates in a corresponding one of the series of electric-component mounting operations; and an in-operation nozzle exchanging device which exchanges a defective suction nozzle with a normal suction nozzle in the series of electric-component mounting operations. Since the defective suction nozzle is exchanged with a normal one in the series of EC mounting operations, the present apparatus can continue, without the defective nozzle, the series of EC mounting operations after the nozzle exchange till the end of the last one of the series of EC mounting operations. Therefore, the degree of lowering of the EC mounting efficiency can be decreased as compared with the case where the nozzle exchange is carried out after the end of the series of EC mounting operations.

(20) According to a twentieth feature of the present invention that includes the nineteenth feature (19), the in-operation nozzle exchanging device exchanges the defective suction nozzle with the normal suction nozzle in the one of the series of electric-component mounting operations in which the mounting device mounts the plurality of electric components on the each circuit substrate. The present apparatus can enjoy the same advantages as those of the EC mounting apparatus according to the third feature (3).

(21) According to a twenty-first feature of the present invention, there is provided a method of moving at least one suction nozzle holding, by suction, an electric component, and mounting, on a circuit substrate, the component held by the nozzle, the method comprising the steps of detecting a defect of the suction nozzle, and automatically exchanging the defective suction nozzle having the detected defect, with a normal suction nozzle. The present method can enjoy the same advantages as those of the EC mounting apparatus according to the first feature (1).

(22) According to a twenty-second feature of the present invention, there is provided a method of performing a series of electric-component mounting operations in each of which a plurality of electric components are mounted, according to a prescribed electric-component mounting program, on a corresponding one of a plurality of circuit substrates, the method comprising the step of exchanging a defective suction nozzle with a normal suction nozzle in the series of electric-component mounting operations. The present method can enjoy the same advantages as those of the EC mounting apparatus according to the second feature (2).

(23) According to a twenty-third feature of the present invention that includes the twenty-second feature (22), the step of exchanging the defective suction nozzle with the normal suction nozzle comprises exchanging the defective suction nozzle with the normal suction nozzle in the each of the series of electric-component mounting operations in which the plurality of electric components are mounted on the one circuit substrate. The present method can enjoy the same advantages as those of the EC mounting apparatus according to the third feature (3).

(24) According to a twenty-fourth feature of the present invention that includes the twenty-second or twenty-third feature (22) or (23), the mounting method further comprises detecting, in the series of electric-component mounting operations, a defect of a suction nozzle, and the step of exchanging the defective suction nozzle with the normal suction nozzle comprises exchanging the defective suction nozzle having the detected defect, with the normal suction nozzle, to prevent the defective suction nozzle from holding, by suction, any other electric component.

(25) According to a twenty-fifth feature of the present invention that includes the twenty-second or twenty-third feature (22) or (23), the mounting method further comprises detecting, in the series of electric-component mounting operations, a defect of a suction nozzle, and continuing the series of electric-component mounting operations without instantly exchanging the defective suction nozzle having the detected defect, with the normal suction nozzle, and the step of exchanging the defective suction nozzle with the normal suction nozzle comprises exchanging, when a predetermined condition is satisfied, the defective suction nozzle having the detected defect, with the normal suction nozzle. The predetermined condition is, for example, that an amount of curving of the suction nozzle is too great to use the nozzle for mounting ECs on a CS; that all ECs have been mounted on one CS; that the series of EC mounting operations has ended; that in the case where a plurality of suction nozzles are employed, a defect of each of the nozzles has been detected; or that in the case where the series of EC mounting operations includes a waiting step in which the suction nozzle waits for mounting ECs, the waiting step has started. In the present EC mounting method, since a timing at which the defective nozzle is exchanged with a normal one is delayed from a timing at which the defective nozzle is detected, the period of use of the nozzle is increased, which leads to reducing the increase of the cost of nozzles. In addition, in the case where the defective nozzle is exchanged with a normal one in the waiting step in which the nozzle is not used for mounting ECs on a CS, the decrease of the EC mounting efficiency is reduced.

Each of the twenty-first to twenty-fifth features (21) to (25) of the EC mounting method according to the present invention may be combined with any one of the first to twentieth features (1) to (20) of the EC mounting apparatus according to the present invention.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 18 is a schematic view of a so-called "line sensor" as a nozzle-defect detecting device of another EC mounting apparatus as a third embodiment of the present invention;

FIG. 19 is a view of a surface-image taking device as a nozzle-defect detecting device of another EC mounting apparatus as a fourth embodiment of the present invention;

FIGS. 20A, 20B, 20C, and 20D are views for explaining the manner in which the nozzle-defect detecting device of FIG. 19 detects each of various sorts of defects of suction nozzles;

FIG. 21 is a flow chart representing a nozzle-defect detecting routine pre-stored in a ROM of a computer as a control device of another EC mounting apparatus as a fifth embodiment of the present invention;

DETAILED DESCRIPTION OF THE PREFERRED EMBODIMENTS

Hereinafter, there will be described an electric-component ("EC") mounting system 10 including two EC mounting apparatuses 20, 22 to which the present invention is applied. Each of the two EC mounting apparatuses 20, 22 carries out an EC mounting method to which the present invention is also applied.

Figure 1:
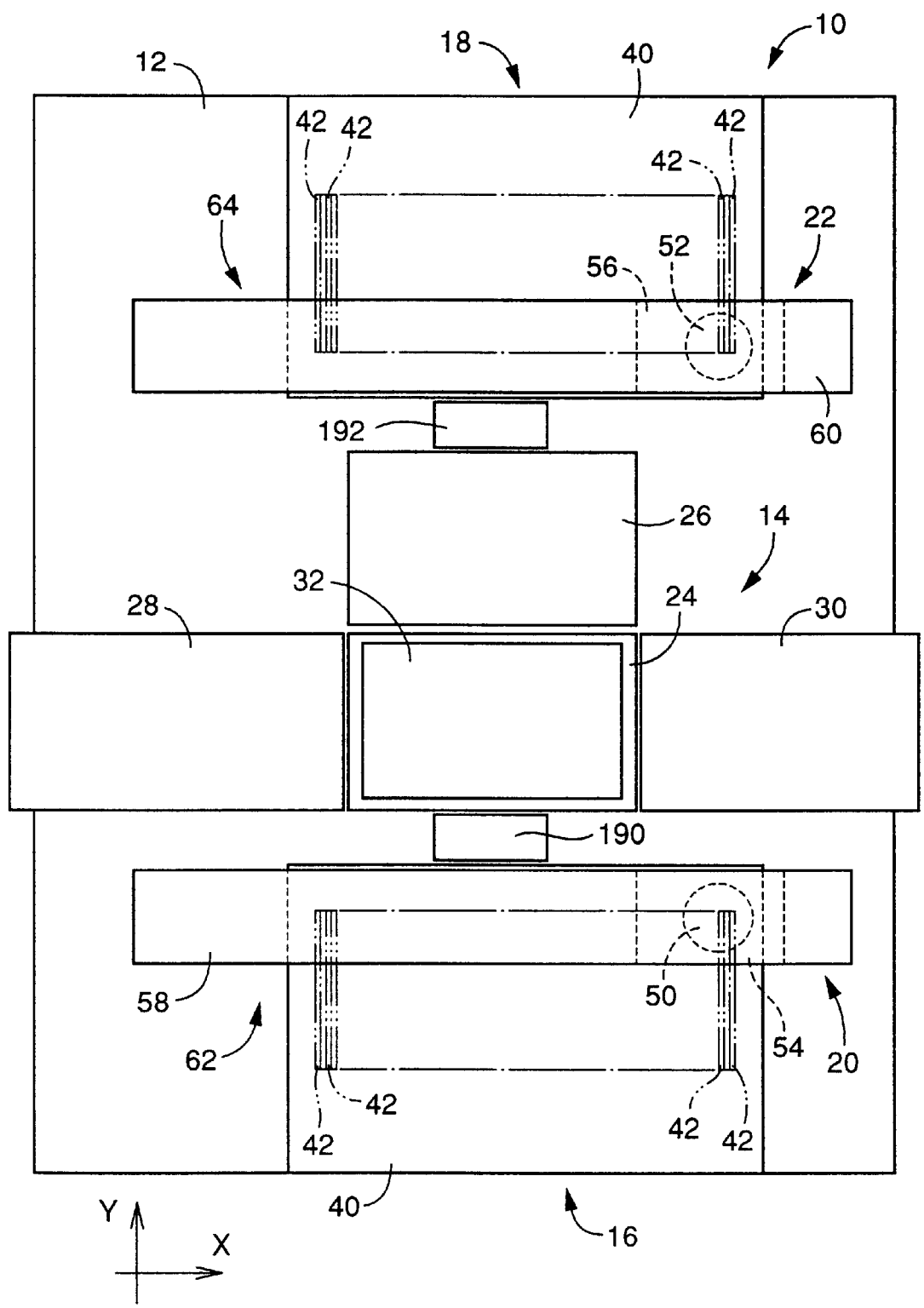
FIG. 1 is a schematic plan view of an electric-component ("EC") mounting system which includes an EC mounting apparatus embodying the present invention and which carries out an EC mounting method also embodying the present invention.

The EC mounting system 10, shown in FIG. 1, is part of an electric-circuit assembly line which includes, in addition to the EC mounting system 10, a screen printing system (not shown) as an upstream-side device provided on an upstream side of the EC mounting system 10 in a direction in which a circuit substrate ("CS") is conveyed, and a solder reflowing system (not shown) as a downstream-side device provided on a downstream side of the EC mounting system 10. The screen printing system is a sort of solder-paste applying system which applies solder paste to the CS, that is, prints the solder paste on the CS, for providing a printed circuit board ("PCB") 32 on which ECs 92 are to be mounted by the EC mounting system 10. The solder reflowing system reflows or melts the solder paste printed on the PCB 32 and electrically connects the ECs 92 to the PCB 32.

The EC mounting system 10 will be described below.

In FIG. 1, reference numeral 12 designates a base on which a PCB conveying device 14, two EC supplying devices 16, 18, and the two EC mounting apparatuses 20, 22 are provided. The PCB conveying device 14 and the EC supplying devices 16, 18 have the same constructions as those of the PCB conveying device and EC supplying devices disclosed in U.S. patent application Ser. No. 08/977, 662 assigned to the Assignee of the present application. In addition, the EC mounting apparatuses 20, 22, except respective portions thereof relating to the detection of suction-nozzle defects and the exchange of suction nozzles that will be described later, have the same constructions as those of the EC mounting devices disclosed in the above-indicated U.S. Patent Application. Therefore, first, relevant portions of the devices and apparatuses 14, 16, 18, 20, 22 are described and then the detection of suction-nozzle defects and the exchange of suction nozzles are described.

The PCB conveying device 14 includes two main conveyors 24, 26, a single carry-in conveyor 28, and a single carry-out conveyor 30. The two main conveyors 24, 26 include respective PCB positioning and supporting devices each of which positions and supports the PCB 32 as the CS, and are juxtaposed, that is, arranged side by side, in a direction (i.e., Y-axis direction) which is perpendicular, on a horizontal plane, to a direction (i.e., X-axis direction) in which the PCB 32 is conveyed. The X-axis direction will be referred as the "PCB-convey direction", if appropriate. The X-axis direction, i.e., the PCB-convey direction is the direction from the left-hand side to the right-hand side in FIG. 1.

The carry-in conveyor 28 is provided on the upstream side of the main conveyors 24, 26 in the PCB-convey direction, and is shifted by a carry-in-conveyor shifting device (not shown) to a first shift position where the carry-in conveyor 28 is aligned with the first main conveyor 24 and to a second shift position where the carry-in conveyor 28 is aligned with the second main conveyor 26. The carry-in conveyor 28 receives, from the screen printing device, the PCB 32 on which the solder paste has been screen-printed by the printing device, and carries in the PCB 32 to the first or second main conveyor 24, 26.

The carry-out conveyor 30 is provided on the downstream side of the main conveyors 24, 26 in the PCB-convey direction, and is shifted by a carry-out-conveyor shifting device (not shown) to a first shift position where the carry-out conveyor 30 is aligned with the first main conveyor 24 and to a second shift position where the carry-out conveyor 30 is aligned with the second main conveyor 26. The carry-out conveyor 30 receives, from the first or second main conveyor 24, 26, the PCB 32 on which the ECs 92 have been mounted by the EC mounting apparatuses 20, 22, and carries out the PCB 32 to the paste reflowing system.

Each of the EC supplying devices 16, 18 includes a plurality of EC feeders 42 each of which is detachably attached to a feeder-support table 40. Each of the EC feeders 42 includes a tape feeding device which feeds a plurality of ECs 92 in the form of an EC carrier tape and supplies the ECs 92 one by one to an EC-supply portion of the each feeder 42. The plurality of EC feeders 42 are attached to the feeder-support table 40 such that the respective EC-supply portions of the EC feeders 42 are arranged along a straight line parallel to the X-axis direction.

The EC mounting apparatuses 20, 22 include respective EC mounting heads 50, 52, and respective X-Y robots 62, 64 which include respective X-axis slides 54, 56 and respective Y-axis slides 58, 52 and which move the respective EC mounting heads 50, 60 to respective arbitrary positions on a horizontal plane. Since the two EC mounting heads 50, 52 have the same construction and the two X-Y robots 62, 64 have the same construction, only the EC mounting head 50 and the X-Y robot 62 will be described below.

Figure 2:
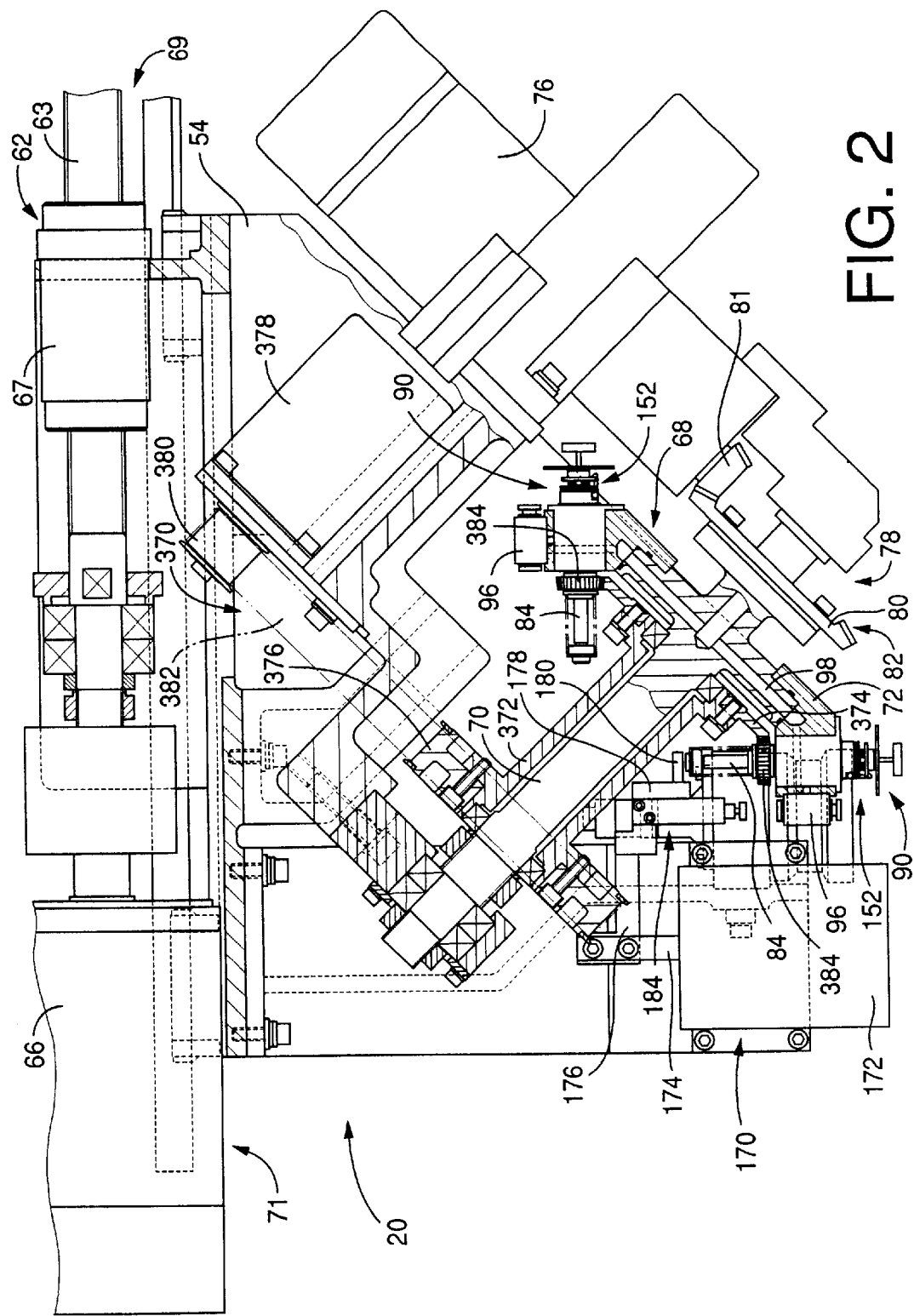
FIG. 2 is a front cross-section view of a relevant portion of an intermittent-rotation body as part of the EC mounting apparatus of FIG. 1.

The Y-axis slide 58 is provided on the base 12 such that the Y-axis slide 58 is movable in the Y-axis direction, and the X-axis slide 54 is provided on the Y-axis slide 58 such that the X-axis slide 54 is movable in the X-axis direction. The Y-axis slide 58 is moved in the Y-axis direction by a Y-axis-slide moving device including a Y-axis servomotor 65 (FIG. 14) as a drive source and a motion converting device which converts the rotation of the Y-axis servomotor 65 into linear motion and transmits the linear motion to the Y-axis slide 58. Similarly, the X-axis slide 54 is moved, as shown in FIG. 2, in the X-axis direction by an X-axis-slide moving device 71 including an X-axis servomotor 66 (FIG. 14) as a drive source and a motion converting device 69 which converts the rotation of the X-axis servomotor 66 into linear motion and transmits the linear motion to the X-axis slide 54. The motion converting device 69 includes a feed screw 63 and a nut 67.

The EC mounting head 50 includes an intermittent-rotation ("IR") body 68 (FIG. 2) which is attached to the X-axis slide 54 such that the IR body 68 is intermittently rotatable about an axis line inclined with respect to a vertical line perpendicular to the horizontal plane. The rotation body 68 includes an axis member 70 which is supported by the X-axis slide 54 such that the axis member 70 is rotatable about the inclined axis line; and a shaft-member supporting member 72 which is fixed to the axis member 70. The shaft-member supporting member 72 has sixteen support holes 74, such that the sixteen support holes 74 are equiangularly spaced from one another about the inclined axis line of the axis member 70 and such that respective center lines of the sixteen support holes 74 are defined by sixteen generators of a conical surface whose center line coincides with the inclined axis line. The IR body 68 is attached to the X-axis slide 54 such that the axis line of the axis member 70 is inclined relative to a vertical line perpendicular to a horizontal mounting-head-convey plane along which the mounting head 50 is conveyed by the X-Y robot 62, by an angle which assures that one of the sixteen generators of the conical surface perpendicularly intersects the horizontal mounting-head-convey plane.

The IR body 68 is precisely rotated by an arbitrary angle in each of opposite directions about the inclined axis line of the axis member 70, by a rotating device 78 including a servomotor 76 as a drive source. The servomotor 76 is provided on the X-axis slide 54 such that an axis line of the motor 76 is perpendicular to the axis line of rotation of the IR body 68 (i.e., the inclined axis line of the axis member 70) and is inclined relative to the vertical line such that the upper portion of the axis line of the motor 76 is the more distant portion thereof from the inclined axis line. The rotation of the servomotor 76 is transmitted to the axis member 70 via a driven bevel gear 80 and a drive bevel gear 81 as a driven wheel and a drive wheel that are meshed with each other, so that the IR body 68 is rotated.

Figure 3:
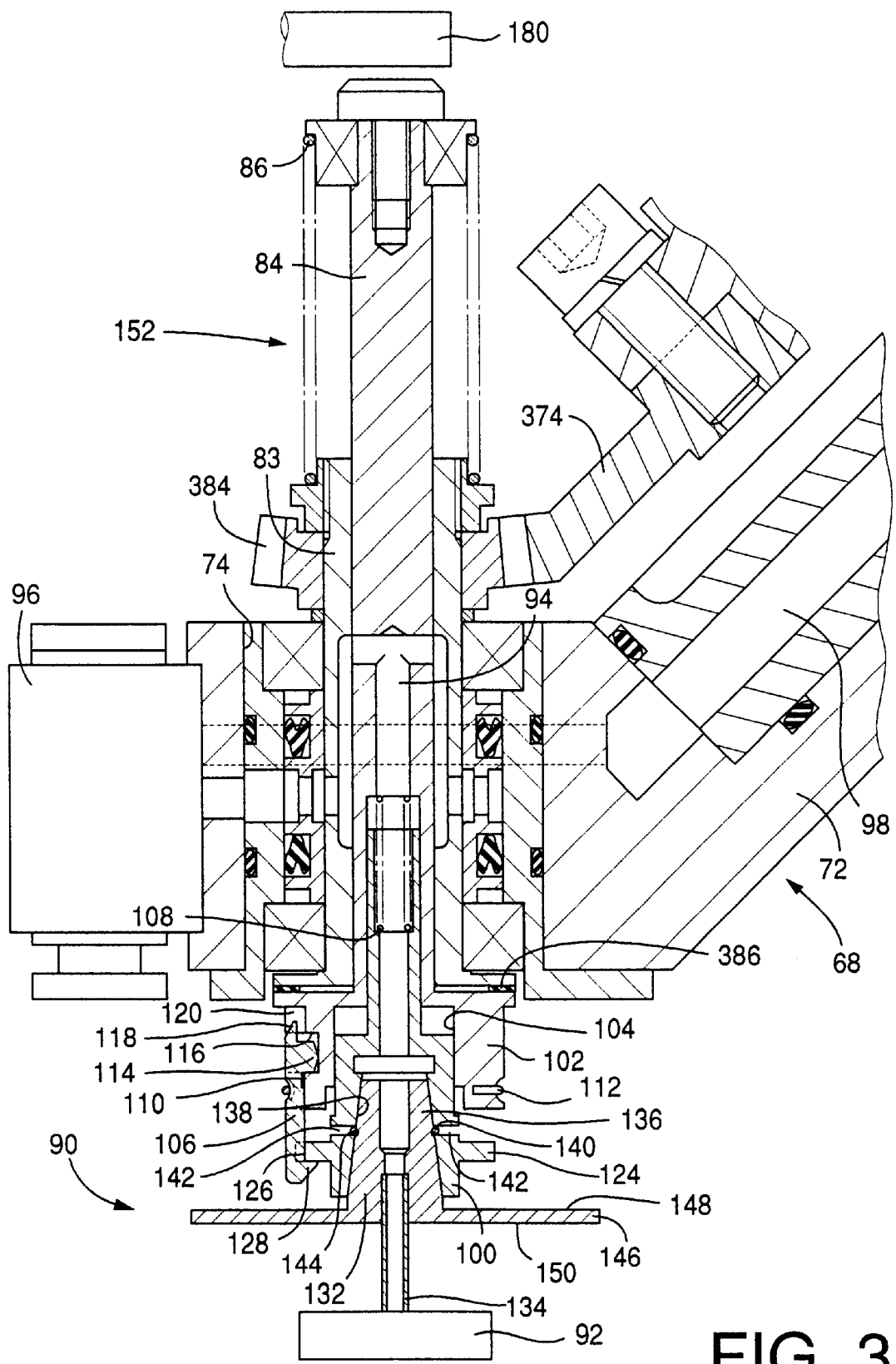
FIG. 3 is a front cross-section view of an EC suction nozzle and a nozzle holder which are supported by the intermittent-rotation body of FIG. 2.

As shown in FIG. 3, sixteen sleeve members 83 each as a rotatable member are fitted in the sixteen support holes 74 of the shaft-member supporting member 72, respectively, such that each of the sleeve members 83 is not movable in an axial direction thereof parallel to the axis line of rotation of the IR body 68 and is rotatable about its own axis line. The sixteen shaft members 84 are fitted in the sixteen sleeve members 83, respectively, such that each of the shaft members 84 is movable relative to the corresponding sleeve member 83 in an axial direction thereof parallel to the rotation axis line of the IR body 68 and is rotatable about its own axis line together with the corresponding sleeve member 83. The sixteen shaft members 84 are biased upward by respective compression coil springs 86 each as a spring member as an elastic member as a sort of biasing member or device, respectively. When the IR body 68 is rotated, the sixteen shaft members 84 are revolved about the rotation axis line of the IR body 68.

The sixteen shaft members 84 carry, at respective lower end portions thereof projecting downward from the IR body 68, respective EC suction nozzles 90. Each of the EC suction nozzle 90 sucks and holds an EC 92 by applying negative air pressure or vacuum to the EC 92. Each suction nozzle 90 is connected to a passage 94 formed in the corresponding shaft member 84, and a corresponding switch valve 96 attached to the IR body 68. The switch valve 96 is connected to a vacuum source (not shown) via a passage 98 formed in the IR body 68. The switch valve 96 is switched, by a switch-valve control device (not shown), to a vacuum-supply position where the valve 96 changes the air pressure in the suction nozzle 90, from a value greater than the atmospheric pressure to a negative value, thereby enabling the nozzle 90 to suck an EC 92, and to an EC-release position where the valve 96 changes the air pressure of the nozzle 90, from the negative value to the value greater than the atmospheric pressure, thereby allowing the nozzle 90 to release the EC 92. Even when the IR body 68 is rotated, the passages 98 formed in the IR body 68 are kept communicated with a passage which is formed in the X-axis slide 54 and is connected to the vacuum source.

As shown in FIG. 3, each of the EC suction nozzles 90 is attached to the corresponding shaft member 84 via an adaptor 100. The adaptor 100 is fitted in a receiving hole 104 formed in a nozzle holding portion 102 provided at the lower end portion of the shaft member 84. The adaptor 100 is movable relative to the shaft member 84 in the axial direction thereof. The adaptor 100 is held by a plurality of holding members 106 (only one holding member 106 is shown in FIG. 3) which are supported by the nozzle holding portion 102 such that the plurality of holding members 106 are equiangularly spaced from each other about the axis line of the shaft member 84. The adaptor 100 is biased in a direction in which the adaptor 100 projects downward from the nozzle holding portion 102, by a compression coil spring 108 as a spring member as an elastic member as a sort of biasing device.

The nozzle holding portion 102 has a plurality of grooves 110 which extend parallel to the axis line of the shaft member 84 and which are equiangularly spaced from each other about the same axis line. The holding members 106 are fitted in the grooves 110, respectively, such that the holding members 106 are pivotable in the grooves 110. The holding members 106 are supported on the nozzle holding portion 102, with the help of an annular spring member 112 which is fitted on the holding portion 102. The holding members 106 include respective projections 114 which project toward the center line of the nozzle holding portion 102 and which are fitted in respective holes 116 formed in the holding portion 102 such that each of the holding members 106 is contacted with a bottom surface of the corresponding hole 116 and is pivotable about an axis line perpendicular to a lengthwise direction thereof and tangential to a portion of the holding portion 102 to which the each holding member 106 is attached.

In addition, each holding member 106 includes an operative portion 118 which is provided above the projection 114 and is fitted in a hole 120 formed in the nozzle holding portion 102. Since the projection 114 and the operative portion 118 of each holding member 106 are fitted in the holes 110, 120 of the nozzle holding portion 102, respectively, the each holding member 106 is prevented from being pivoted about an axis line which perpendicularly intersects the axis line of the shaft member 84.

A lower portion of each of the holding members 106 is fitted in a corresponding one of a plurality of holes 126 formed in a large-diameter engaging portion 124 of the adaptor 100. Thus, the adaptor 100 is prevented from being rotated relative to the nozzle holding portion 102. Each holding member 106 has an engaging projection 128 which projects from a lower end portion thereof toward the adaptor 100 and which is engageable with a lower surface of the large-diameter engaging portion 124. Thus, the adaptor 100 is prevented from coming out of the receiving hole 104 of the nozzle holding portion 102. In the state in which the respective engaging projections 128 of the holding members 106 are disengaged from the engaging portion 124 of the adaptor 100, by pushing the operative portions 118 of the holding members 106 and thereby pivoting the holding members 106 against the biasing force of the spring member 112, the adaptor 100 can be removed from the nozzle holding portion 102 of the shaft member 84.

Each of the EC suction nozzles 90 includes a pipe holding member 132, and a suction pipe 134 held by the holding member 132. The pipe holding member 132 includes a tapered portion 136 as a fitted portion which is fitted in a tapered hole 138 as a receiving hole which is formed in the adaptor 100. The pipe holding member 132 is supported on the adaptor 100 with the help of a generally U-shaped spring member 140. Two arm portions of the spring member 140 are fitted in two grooves 142 formed in the adaptor 100, respectively. The distance between the two arm portions decreases in a direction toward respective free ends of the arm portions, and respective free-end portions of the two arm portions are bent toward each other. Thus, the spring member 140 is prevented from coming off the adaptor 100.

In the state in which the tapered portion 136 is fitted in the tapered hole 138, the spring member 140 is fitted in an annular groove 144 formed in an outer surface of the tapered portion 136. Thus, the spring member 140 engages the tapered portion 136, thereby holding the pipe holding member 132. In addition, the spring member 140 draws the tapered portion 136 of the pipe holding member 132, into the tapered hole 138 of the adaptor 100. Thus, the pipe holding member 132 is positioned relative to the adaptor 100. The spring member 140 is fitted in the annular groove 144 such that a center of a circular cross section of the spring member 140 is not aligned with a center of a semi-circular cross section of the groove 144, that is, is positioned slightly above the center of the semi-circular cross section. Therefore, the spring member 140 engages an upper portion of the groove 144, thereby drawing the pipe holding member 132 into the tapered hole 138. The EC suction nozzle 90 can be removed from the adaptor 100, by applying, to the nozzle 90, a force greater than a predetermined value, i.e., the nozzle drawing force of the spring member 140, in a direction toward a free end of the nozzle 90. The adaptors 100 are detachably attached to the shaft members 84, and cooperate with the support shafts 84 to provide sixteen nozzle holders 152. Thus, the IR body 68 supports the sixteen nozzle holders 152 to which the sixteen suction nozzles 90 are detachably attached. It can be said that the shaft members 84 hold the EC suction nozzles 90 via the adaptors 100, respectively. Reference numeral 146 designates a disc-like light emitting plate which is formed of aluminum and has a high degree of reflectance. An upper surface of the plate 146 functions as a light reflecting surface 148. A layer formed of a luminescent material is formed on a lower surface 150 of the plate 146 from which the suction pipe 134 projects. The luminescent layer absorbs an ultra-violet light and emits a visible light toward the EC 92.

The IR body 68 is intermittently rotated at an intermittent-rotation angular pitch equal to a spacing angular pitch at which the sixteen shaft members 84 are equiangularly spaced from one another about the axis line of rotation of the IR body 68. When the IR body 68 is intermittently rotated, the sixteen nozzle holders 152 (i.e., the shaft members 84 and the adaptors 100) are revolved about the axis line of rotation of the IR body 68 and are sequentially stopped at sixteen stop positions. One of the sixteen stop positions where one of the respective axis lines of the sixteen shaft members 84 perpendicularly intersects the horizontal mounting-head-convey plane is an EC-suck-and-mount position where the EC suction nozzles 90 suck ECs 92 (i.e., receives the ECs 92 from the EC feeders 42 of the supplying device 16) and mount the ECs 86 on the PCB 32. One of the sixteen stop positions that is angularly distant by 90 degrees downstream from the EC-suck-and-mount position as seen in the direction of rotation of the IR body 68 is an EC-image-take position. An EC-image taking device 160 (FIG. 14) is provided at a position on the X-axis slide 54 that corresponds to the EC-image-take position. In addition, a reference-mark-image taking device 162 (FIG. 14) which takes respective images of a plurality of reference marks affixed to the PCB 32 is provided on the X-axis slide 54.

In the present embodiment, the mounting-head-convey plane along which the X-axis slide 54, 56 and the Y-axis slide 58, 60 are moved is horizontal. Accordingly, one nozzle holder 152 being stopped at the EC-suck-and-mount position extends in a vertical direction. Since the axis line of rotation of the IR body 68 is inclined relative to the vertical line perpendicular to the horizontal mounting-head-convey plane, the one nozzle holder 152 being stopped at the EC-suck-and-mount position takes the lowest position, while the other nozzle holders 152 take upper positions. In the present EC mounting apparatus 20, the sixteen nozzle holders 152 take different height positions because of the inclination of the axis line of rotation of the IR body 68.

As shown in FIG. 2, an elevating and lowering device 170 which elevates and lowers each of the nozzle holders 152 is provided at a position on the X-axis slide 54 that corresponds to the EC-suck-and-mount position. The elevating and lowering device 170 includes a linear motor 172 as a drive source. The linear motor 172 includes a housing and a movable portion 174 which projects vertically upward from the housing and to which a movable member 176 is fixed. A drive member 178 is fixed to the movable member 176, and includes a drive portion 180.

When the movable member 176 is lowered by the linear motor 172, the drive member 178 is lowered, so that the drive portion 180 is lowered to engage the shaft member 84 of the nozzle holder 152 being stopped at the EC-suck-and-mount position. Consequently the nozzle holder 152 is lowered against the biasing force of the compression coil spring 86 (if the EC suction nozzle 90 is held by the nozzle holder 152, the nozzle 90 is also lowered). When the movable member 176 is elevated and accordingly the drive member 178 is elevated, the drive portion 180 is also elevated. Consequently the shaft member 84 is also elevated to follow the drive portion 180, owing to the biasing force of the compression coil spring 86, so that the nozzle holder 152 is elevated. Finally, the drive portion 180 is separated from the shaft member 84, and the nozzle holder 152 is held at a position where the holder 152 is fully biased upward by the coil spring 86. This position of the nozzle holder 152 is defined as an upper end position of the same 152. The nozzle holder 152 is lowered from its upper end position to its lower end position where the suction nozzle 90 sucks the EC 92 or mounts the EC 92 on the PCB 32. The distance of upward or downward movement of the drive member 178, that is, the nozzle holder 152 can be adjusted by controlling the linear motor 172 and thereby adjusting the distance of movement of the movable member 176. A mechanical portion 184 of the switch-valve control device that switches the switch valve 96 in timed relation with the upward or downward movement of the drive member 178, is provided at a position that is on the X-axis slide 54 in the vicinity of the EC-suck-and-mount position. However, description of the mechanical portion is omitted.

A nozzle rotating device 370 which rotates each nozzle holder 152 about its own axis line and thereby rotates the EC suction nozzle 90 about its own axis line is provided on the X-axis slide 54. The nozzle rotating device 370 corrects an angular-position error of the EC 92 held by the nozzle 90, or changes a current angular position of the EC 90 to a predetermined angular position. A hollow axis member 372 as a rotatable member is fitted on the solid axis member 70, such that the hollow axis member 372 is rotatable relative to the solid axis member 70. A drive bevel gear 374 as a drive wheel is formed in a lower end portion of the axis member 372, and a driven pulley 376 is fixed to an upper end portion of the same 372. Rotation of a servomotor 367 as a drive source is transmitted to the driven pulley 376 via a drive pulley 380 and a timing belt 382, so that the drive bevel gear 374 is rotated by an arbitrary angle in each of opposite directions. The servomotor 367 is for correcting or changing the angular position of each EC suction nozzle 90 or the EC 92 held by the same 90. A driven bevel gear 384 as a driven wheel is fixed to each of the sixteen sleeve members 83 which are fitted in the sixteen support holes 74, and is meshed with the drive bevel gear 374. When the drive bevel gear 374 is rotated, the sixteen driven bevel gears 384 are rotated and the corresponding sleeve members 83 are also rotated. The rotation of each sleeve member 83 is transmitted to the corresponding shaft member 84 via an annular friction member 386, so that the suction nozzle 90 held by the nozzle holder 152 is rotated about its own axis line. The hollow axis member 372, the servomotor 378, the drive bevel gear 374, the driven bevel gears 384, etc. cooperate with one another to provide the nozzle rotating device 370.

Figure 4:
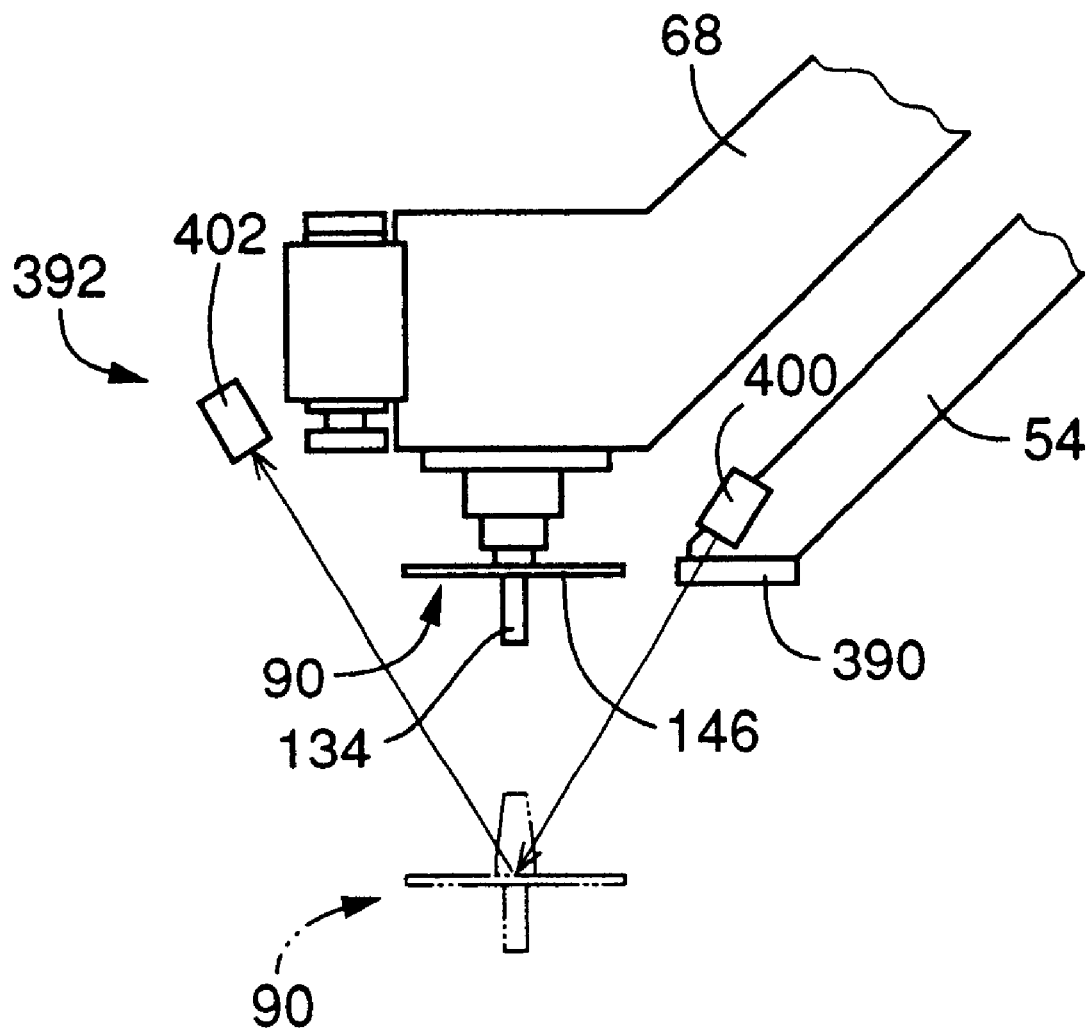
FIG. 4 is a schematic front view of a nozzle-exchange sensor and a nozzle-presence sensor which are supported-by the-EC mounting apparatus of FIG. 1.
Figure 5:
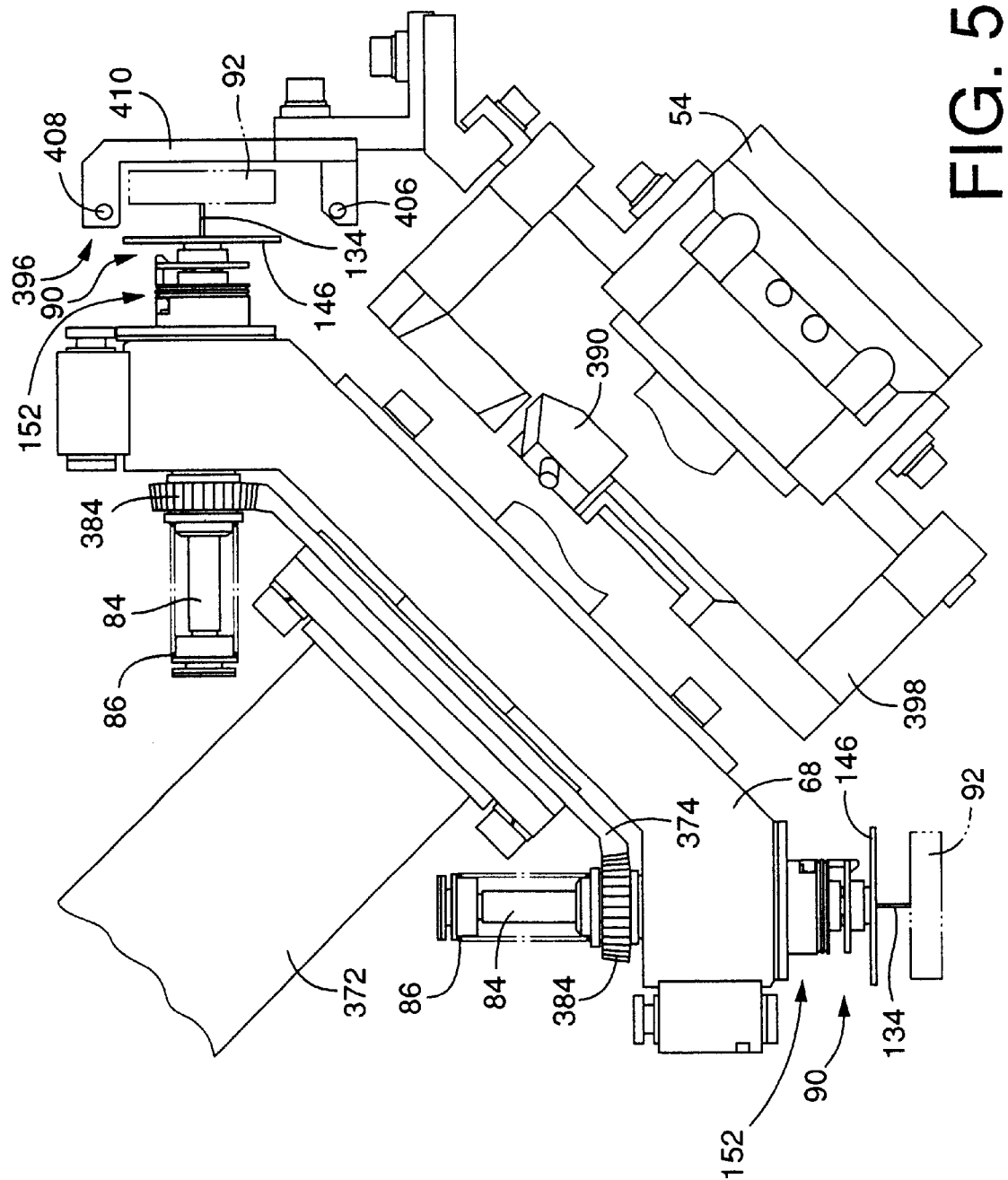
FIG. 5 is a front view of a nozzle-defect sensor which is supported by the EC mounting apparatus of FIG. 1.

As shown in FIG. 4, a nozzle-exchange sensor 390 and a nozzle-presence sensor 392 are provided on a portion of the X-axis slide 54 that corresponds to the EC-suck-and-mount position. In addition, a nozzle-hold sensor 394 (FIG. 14) is provided on a portion of the X-axis slide 54 that corresponds to an upstream one of the sixteen stop positions of the sixteen nozzle holders 152 that is adjacent to the EC-suck-and-mount position as seen in a rotation direction in which the IR body 68 is rotated to move each nozzle holder 152 to the EC-suck-and-mount position. The upstream position will be referred to as the "nozzle-hold-inspect position". Moreover, as shown in FIG. 5, a nozzle-defect sensor 396 is provided on a portion of the X-axis slide 54 that corresponds to the fourth stop position that is upstream of the EC-suck-and-mount position as seen in the rotation direction, i.e., angularly distant by 90 degrees from the EC-suck-and-mount position as seen in a direction parallel to the axis line of rotation of the IR body 68. The fourth stop position will be referred to as the "nozzle-defect-inspect position".

The nozzle-exchange sensor 390 is provided by a reflection-type photoelectric sensor including a light emitting portion and a light receiving portion. The sensor 390 is attached to the X-axis slide 54 via a bracket 398 (FIG. 5), and identifies whether one nozzle holder 152 being stopped at the EC-suck-and-mount position currently holds an EC suction nozzle 90. The light emitting and receiving portions of the sensor 390 are provided, inside the locus of revolution of each nozzle holder 152 about the axis line of the IR body 68, at a position where the light emitting and receiving portions are opposed to the light emitting plate 146 of the suction nozzle 90 held by the one nozzle holder 152 that is stopped at the EC-suck-and-mount position and is held at its upper end position. Therefore, if the one nozzle holder 152 currently holds a suction nozzle 90, the light emitted from the light emitting portion is reflected by the light emitting plate 146 and is incident to the light receiving portion. On the other hand, if the one nozzle holder 152 does not currently hold a suction nozzle 90, the light emitted from the light emitting portion is not reflected by the light emitting plate 146 and is not incident to the light receiving portion. Thus, whether the one nozzle holder 152 currently holds an EC suction nozzle 90 can be identified by judging whether the amount of light received by the light receiving portion is more than a reference value. The nozzle-exchange sensor 390 is used for judging whether two suction nozzles 90 have been exchanged with each other on each nozzle holder 152, as will be described later.

The nozzle-presence sensor 392 is provided by a reflection-type photoelectric sensor including a light emitting portion 400 and a light receiving portion 402. The light emitting portion 400 is attached to the X-axis slide 54 via the bracket 398, and is provided inside the locus of revolution of each nozzle holder 152. The light receiving portion 402 is attached to the X-axis slide 54 via a bracket (not shown), and is provided outside the locus of revolution of each nozzle holder 152. The function of the sensor 392 will be described below.

The nozzle-hold sensor 394 is provided by a reflection-type photoelectric sensor including a light emitting portion and a light receiving portion. The light emitting and receiving portions of the sensor 394 are provided, inside the locus of revolution of each nozzle holder 152, at a position where the light emitting and receiving portions are opposed to the light emitting plate 146 of the suction nozzle 90 held by the one nozzle holder 152 that is stopped at the nozzle-hold-inspect position and is held at its upper end position. Therefore, if the one nozzle holder 152 currently holds a suction nozzle 90, the light emitted from the light emitting portion is reflected by the light emitting plate 146 and is incident to the light receiving portion. On the other hand, if the one nozzle holder 152 does not currently hold a suction nozzle 90, the light emitted from the light emitting portion is not reflected by the light emitting plate 146 and is not incident to the light receiving portion. Thus, whether the one nozzle holder 152 currently holds an EC suction nozzle 90 can be identified by judging whether the amount of light received by the light receiving portion is more than a reference (threshold) value. That the amount of light received by the light receiving portion is not more than the reference value, means, for example, that a suction nozzle 90 has come off the one nozzle holder 152, or that the one nozzle holder 152 holds a suction nozzle 90 but cannot be moved to its upper end position. In either case, it means that a certain abnormality has occurred to the one nozzle holder 152. Thus, the nozzle-hold sensor 394 provides a suction-nozzle detecting device, or a nozzle-holder-abnormality detecting device.

Figure 14:
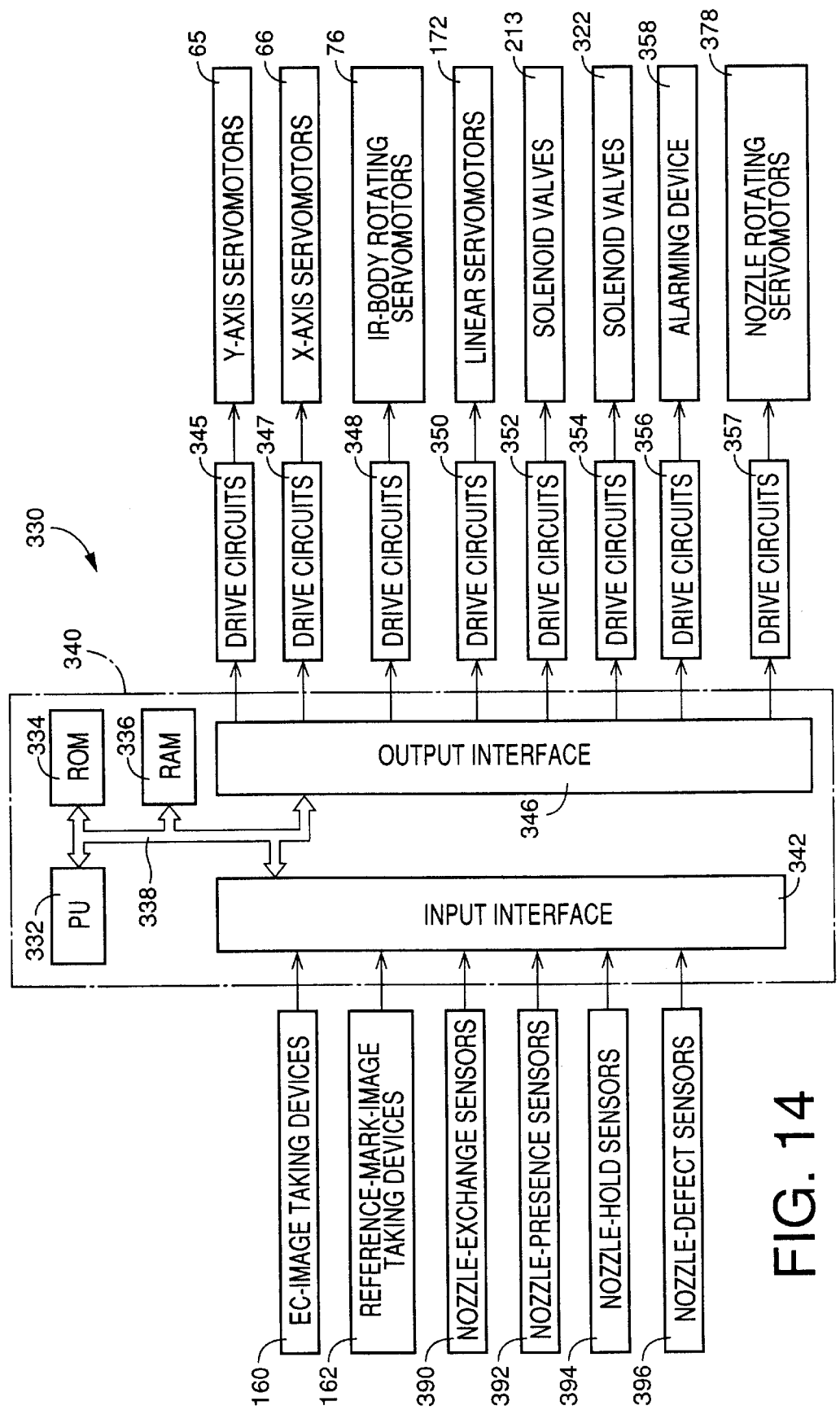
FIG. 14 is a block diagram of a relevant portion of a control device of the EC mounting system of FIG. 1.

As shown in FIG. 5, the nozzle-defect sensor 396 is provided by a reflection-type photoelectric sensor including a light emitting portion 406 and a light receiving portion 408. Each of the light emitting portion 406 and the light receiving portion 408 is provided by a plurality of optical fibers. The light emitting portion 406 is connected to a light source (not shown), and the light receiving portion 408 is connected to a light receiving element (not shown). The light receiving element generates an electric signal having a magnitude corresponding to the number of the optical fibers of the light receiving portion 408 that receive the light emitted from the light emitting portion 406. The light receiving element is connected to a control device 330 (FIG. 14). Respective free ends of the optical fibers of each of the light emitting portion 406 and the light receiving portion 408 cooperate with one another are arranged like a belt. Thus, the light emitting portion 406 emits a belt-like light. In the present embodiment, the width of the belt-like light is slightly smaller than the smallest one of different diameters of respective suction pipes 134 of different sorts of suction nozzles 90 that are designed to be used in each of the EC mounting apparatuses 20, 22. The light emitting portion 406 and the light receiving portion 408 are attached to the X-axis slide 54 via a bracket 410. The light emitting portion 406 is provided inside the locus of revolution of each nozzle holder 152, and the light receiving portion 408 is provided outside the locus, such that an optical axis of the light emitting and receiving portions 406, 408 is perpendicular to the axis line of the suction pipe 134 of the one nozzle holder 152 being stopped at the nozzle-defect-inspect position. In FIG. 5, the nozzle-exchange sensor 390 and the nozzle-defect sensor 396 are not shown at their correct angular positions, for easier understanding purposes only, and the nozzle-presence sensor 392 is omitted. In addition, in FIG. 2, only two nozzle holders 152 and two suction nozzles 90 are shown as representatives of the sixteen holders 152 and the sixteen nozzles 90.

As shown in FIG. 1, a first suction-nozzle storing device 190 is provided between the first main conveyor 24 of the PCB conveyor 14 and the first EC supplying device 16, and a second suction-nozzle storing device 192 is provided between the second main conveyor 26 of the PCB conveyor 14 and the second EC supplying device 18. Since the two suction-nozzle storing devices 190, 192 have the same construction, the storing device 190 will be described as a representative of the two devices 190, 192.

Figure 6:
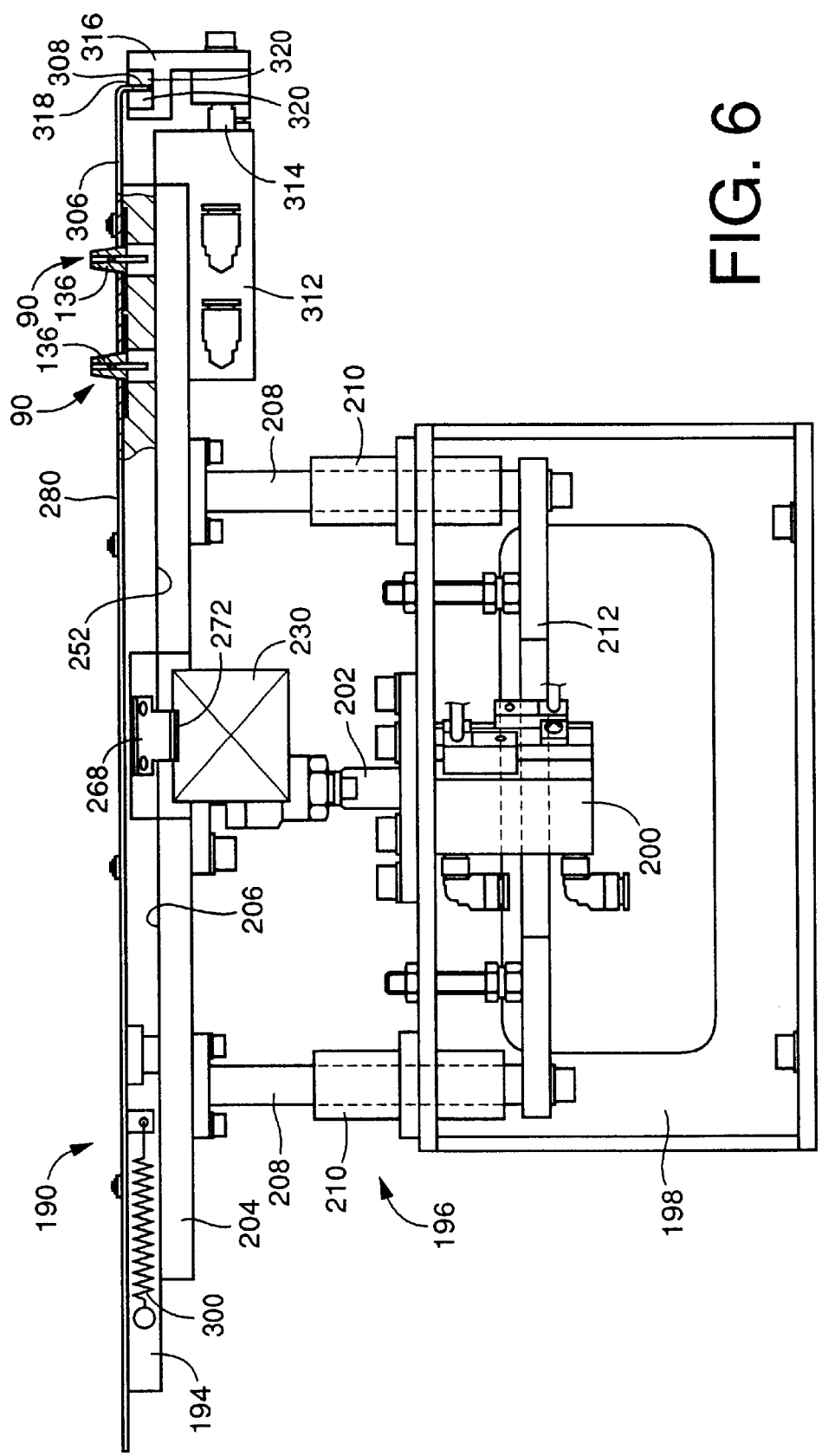
FIG. 6 is a partly cross-sectioned, front view of a suction-nozzle storing device of the EC mounting apparatus of FIG. 1.
Figure 7:
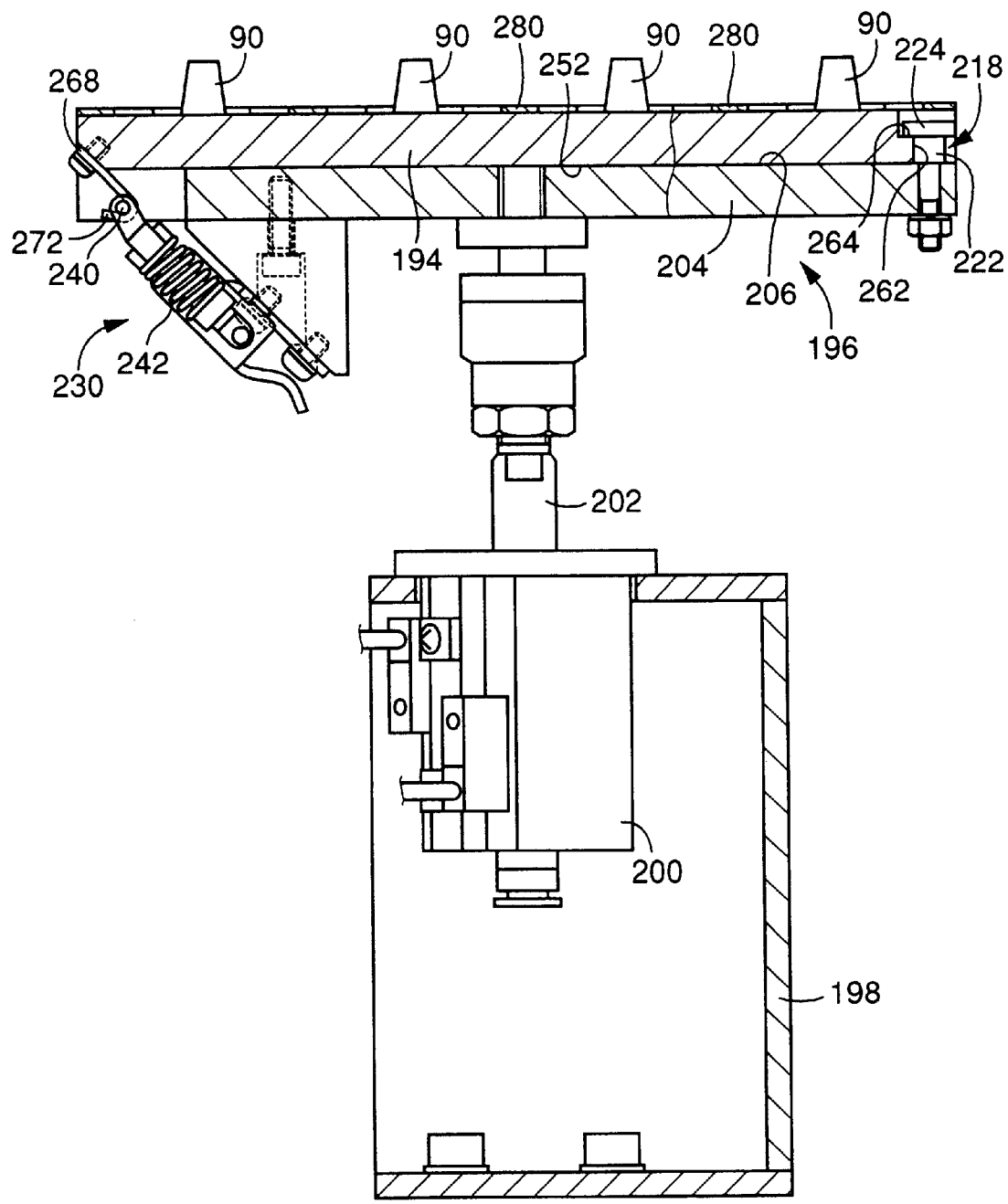
FIG. 7 is a side elevation view of the suction-nozzle storing device of FIG. 6.

As shown in FIG. 6, the suction-nozzle storing device 190 includes a nozzle storing plate 194 as a nozzle storing member, and a storing-plate holding device 196 as a storing-member holding device. The storing-plate holding device 196 includes a plate-like, storing-plate supporting member 204 as a storing-member supporting member whose lengthwise direction is parallel to the X-axis direction, i.e., the PCB-convey direction. The storing-member holding device 196 includes a frame 198 fixed to the base 12 that is not shown in FIG. 6. A pressurized-air-operated cylinder device (hereinafter referred to as the "air cylinder") 200 as a pressurized-fluid-operated cylinder device as a sort of pressurized-fluid-operated actuator as a drive source is fixed to the frame 198 such that the air cylinder 200 is oriented upward. As shown in FIGS. 6 and 7, the storing-member supporting member 204 is fixed to an upper end of a piston rod 202 of the air cylinder 200, such that the supporting member 204 extends horizontally. An upper surface of the supporting member 204 defines a storing-plate supporting surface 206 as a storing-member supporting surface. Two guide rods 208 as guided members that are fixed to a lower surface of the supporting member 204 are fitted in two guide cylinders 210 as guide members that are fixed to the frame 198, such that the guide rods 208 are movable up and down. Respective lower end portions of the two guide rods 208 that project downward from the guide cylinders 210 are connected to each other by a connecting member 212. When a solenoid-operated direction control valve 213 (FIG. 14) is switched, two air chambers of the air cylinder 200 which are or currently communicated with the atmosphere and a pressurized-air supplying source, respectively, are communicated with the pressurized-air supplying source and the atmosphere, respectively, so that the piston rod 202 is moved up or down. Consequently the storing-member supporting member 204 is moved up or down between its upper end position and its lower end position, while keeping its horizontal posture and being guided by the guide rods 208 and the guide cylinders 210. The air cylinder 200 provides a storing-plate elevating and lowering device as a storing-member elevating and lowering device as a sort of storing-member moving device.

Figure 8:
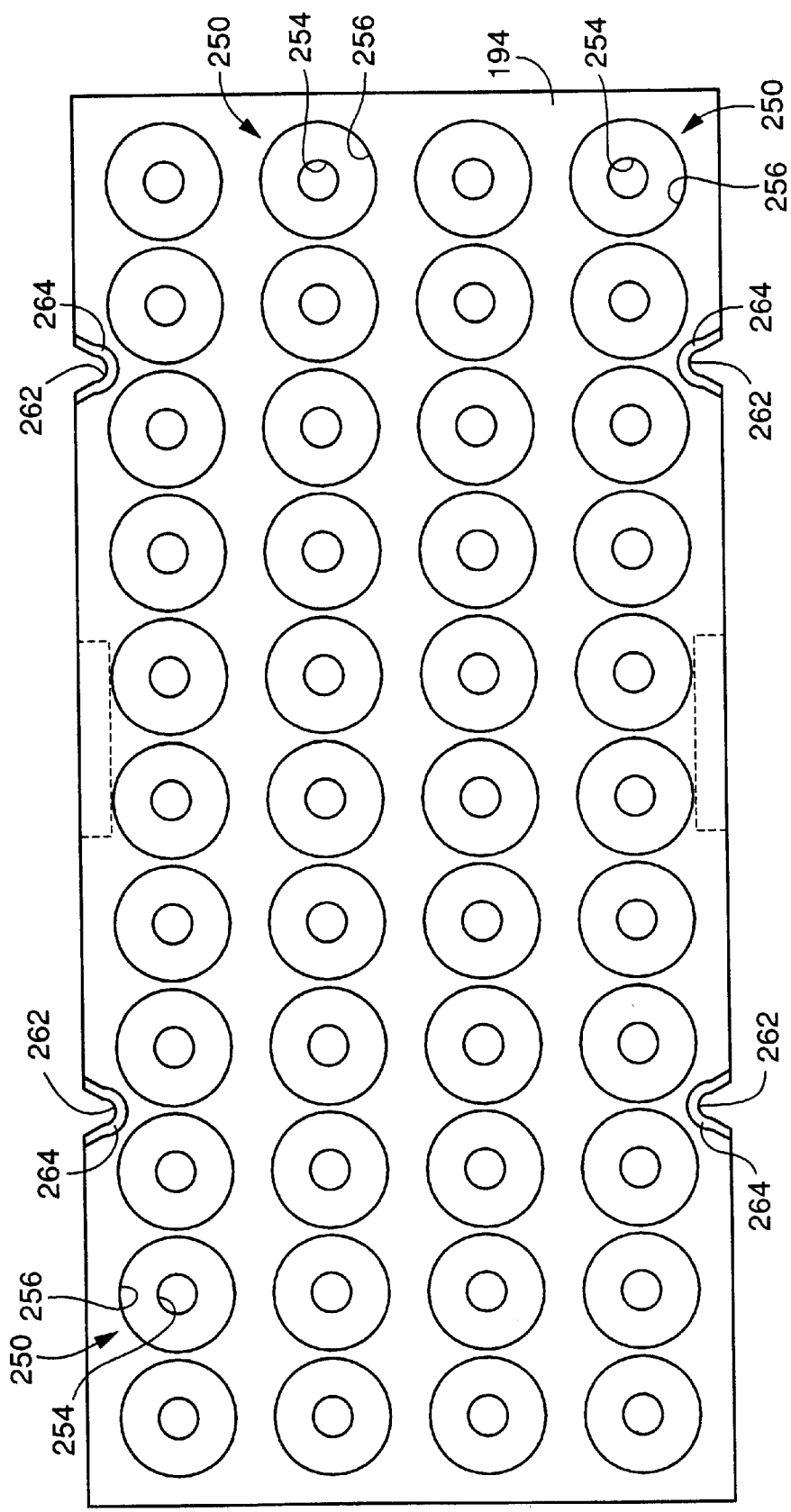
FIG. 8 is a plan view of a nozzle storing plate as part of the suction-nozzle storing device of FIG. 6.
Figure 9:
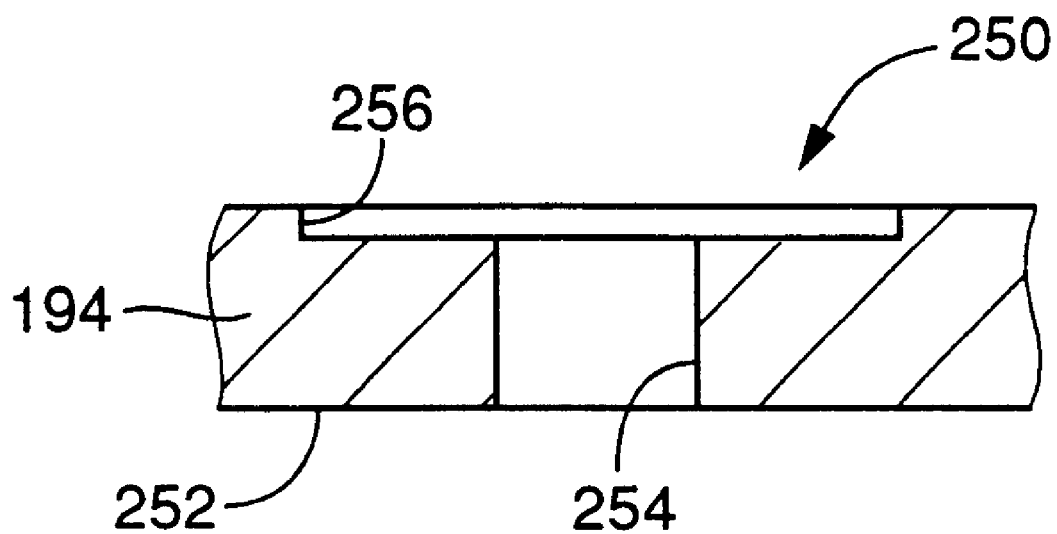
FIG. 9 is a front cross-section view of a nozzle-storing hole of the nozzle storing plate of FIG. 6.

The nozzle storing plate 194 is detachably attached to the storing-plate supporting member 204, without using any tools, and is moved up and down with the storing-plate supporting member 204. As shown in FIGS. 6 and 8, the nozzle storing plate 194 has a generally rectangular plate-like shape, and has a plurality of stepped, nozzle storing holes 250 as nozzle storing recessed portions that are formed in a plane parallel to the plane of the plate 194. The nozzle storing holes 250 are formed through the thickness of the plate 194. As shown in FIGS. 8 and 9, each of the nozzle storing holes 250 includes a small-diameter portion 254 which opens in a supported surface 252 of the storing plate 194 that is supported on the storing-plate supporting member 204; and a large-diameter portion 256 which opens in an opposite surface of the storing plate 194 that is opposite to the supported surface 252. The holes 250 are formed at a regular interval in each of a widthwise and a lengthwise direction of the storing plate 194. The large-diameter portion 256 of each nozzle storing hole 250 has a depth greater than the thickness of the light emitting plate 146 of each EC suction nozzle 90, and the small-diameter portion 254 thereof has a depth greater than the length of the suction pipe 134 of each EC suction nozzle 90. The nozzle storing plate 194 is colored in black to lower its degree of reflectance.

Figure 10:
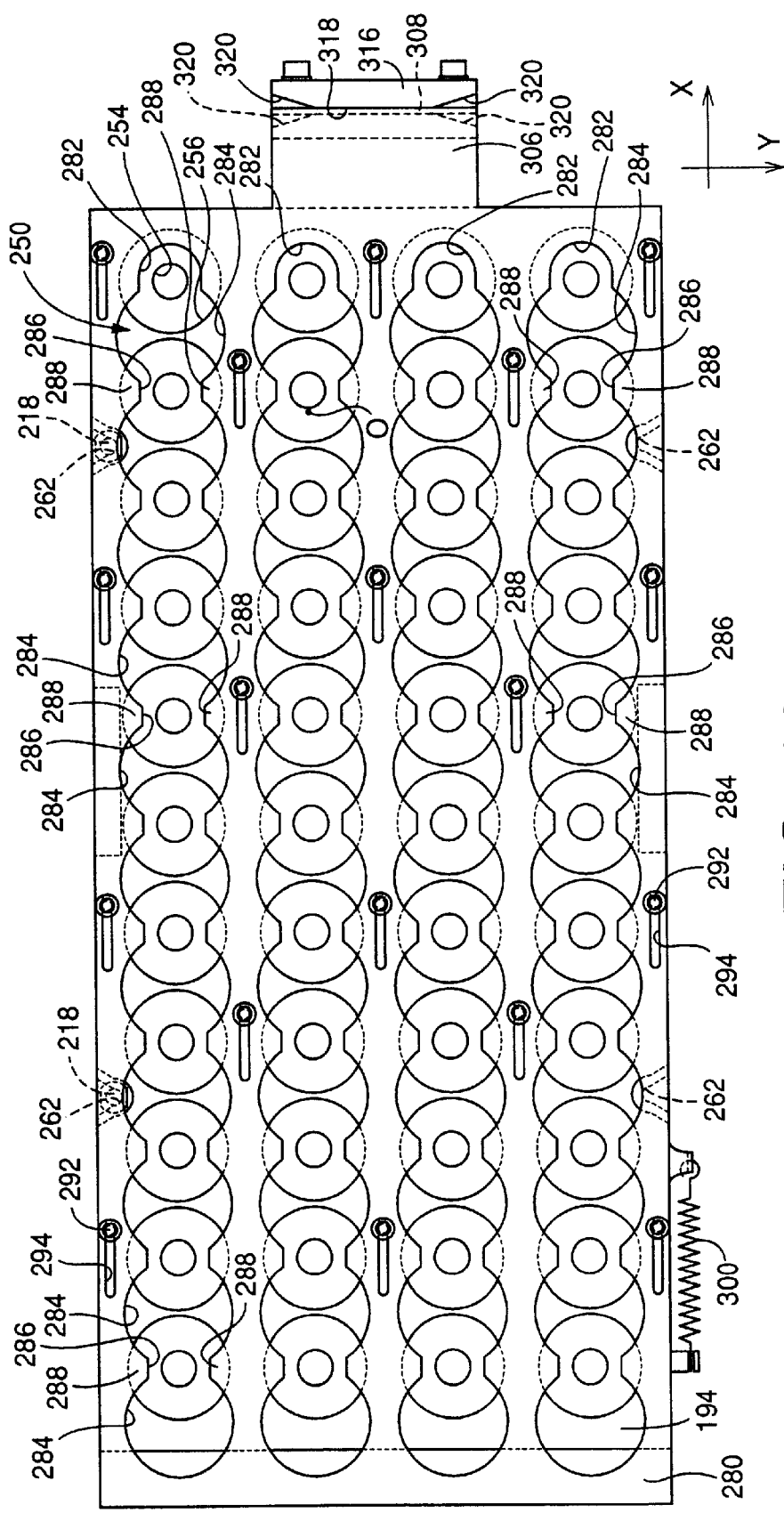
FIG. 10 is a plan view of the nozzle storing plate of FIG. 6 together with a nozzle-removal inhibiting plate which is in its operative position.
Figure 11:
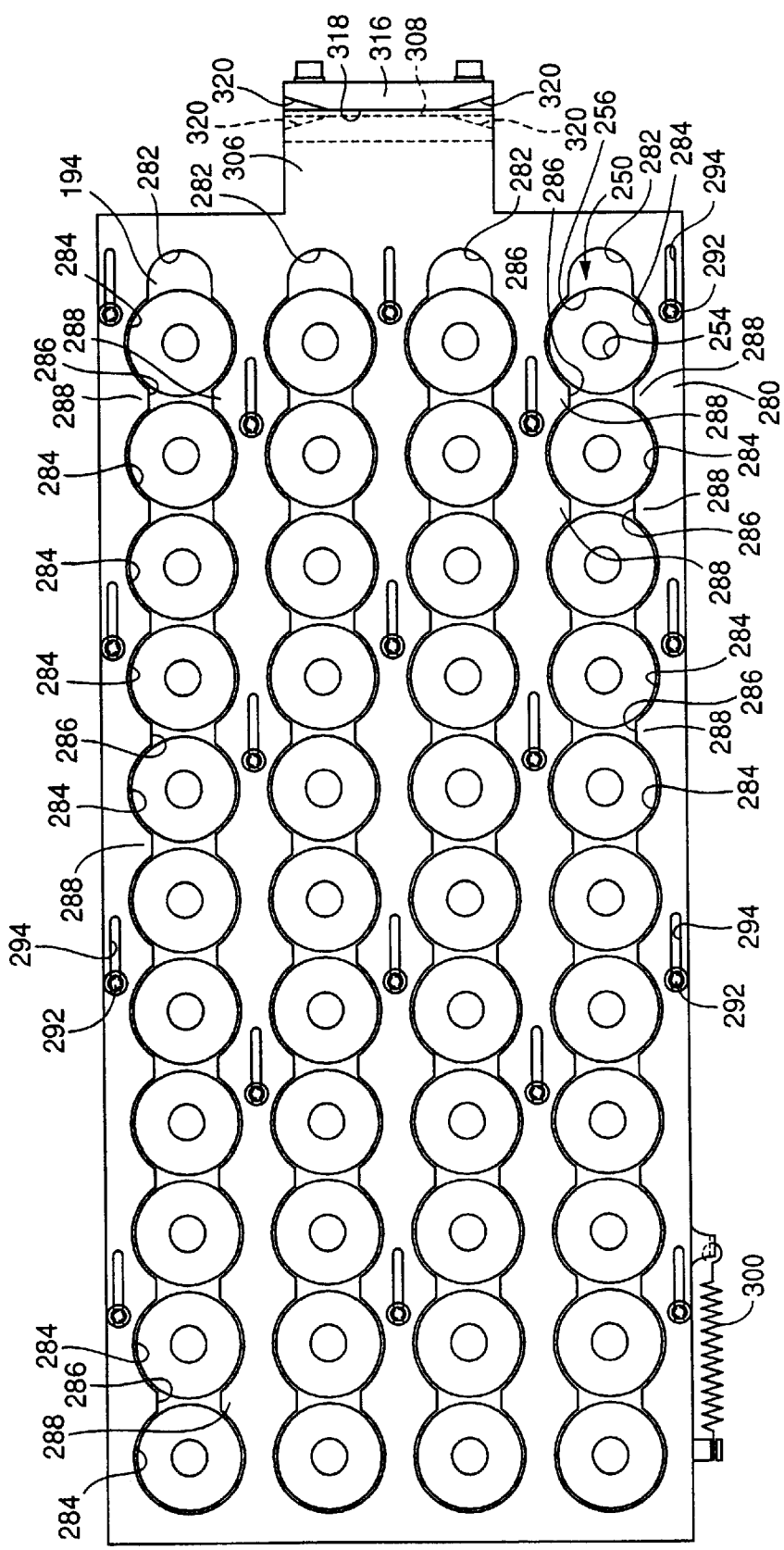
FIG. 11 is a plan view of the nozzle storing plate of FIG. 6 together with the nozzle-removal inhibiting plate which is in its inoperative position.
Figure 12:
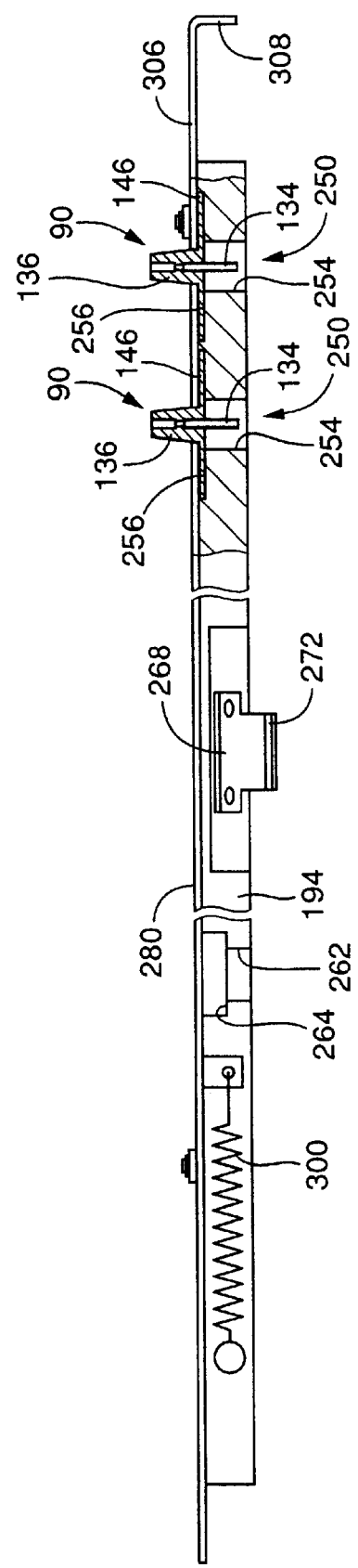
FIG. 12 is a partly cross-sectioned, front elevation view of the nozzle storing plate of FIG. 6 together with the nozzle-removal inhibiting plate.

As shown in FIG. 12, an EC suction nozzle 90 is fitable in each of the nozzle storing holes 250. In FIG. 12, only two nozzles 90 are shown as representatives of all the nozzles 90. In FIGS. 10 and 11, the nozzles 90 are not shown. Each of the nozzles 90 is fitted in one nozzle storing hole 250 such that the suction pipe 134 is fitted in the small-diameter portion 254, the light emitting plate 146 is fitted in the large-diameter portion 256 and supported on a bottom wall of the same portion 256, and the tapered portion 136 of the pipe holding member 132 projects upward from the nozzle storing plate 194. Each nozzle storing hole 250 accommodates a portion of each suction nozzle 90 that is located between the light reflecting surface 148 and the free end of the suction pipe 134, such that the axis line of the suction nozzle 90 is perpendicular to the nozzle storing plate 194. The nozzle storing device 190 stores a plurality of suction nozzles 90 such that each of the nozzles 90 can be individually taken out therefrom.

In the present embodiment, the EC mounting apparatuses 20, 22 can be used in a manner in which each of the mounting heads 50, 52 employs a plurality of suction nozzles 90 all of which is of a same sort, or in a manner in which each of the mounting heads 50, 52 employs a plurality of suction nozzles 90 all or some of which are of different sorts. Respective light emitting plates 146 of the different sorts of suction nozzles 90 have the same diameter, but respective suction pipes 134 of the same 90 have different diameters. An appropriate one of the different sorts of nozzles 90, that is, an appropriate one of the different sorts of suction pipes 134 is selected and used depending upon the shape and dimensions of ECs 92 to be sucked and mounted. In the case where each of the mounting heads 50, 52 employs different sorts of suction nozzles 90, the nozzle storing plate 194 stores the different sorts of nozzles 90, such that the number of nozzles 90 of each sort is proportional to the frequency of use of the each sort of nozzles 90 and such that the nozzles 90 of each sort are located adjacent to each other. The diameter of the respective small-diameter portions 254 of the nozzle storing holes 250 is so predetermined that the suction pipe 134 having the largest diameter can be fitted in each portion 254. The diameter of the respective large-diameter portions 254 of the nozzle storing holes 250 is so predetermined as to be slightly larger than that of the light emitting plates 146 of the nozzles 90. The respective tapered portions 136 of the different sorts of nozzles 90 have the same dimensions.

As shown in FIG. 7, the nozzle storing plate 194 placed on the storing-plate supporting member 204 has four notches 262 two of which are engaged with respective intermediate portions 222 of two headed pins 218 which project upward from the supporting member 204. Thus, the storing plate 194 is prevented from being translated in a direction parallel to the supported surface 252, and from being rotated about an axis line perpendicular to the same 252. In addition, as shown in FIG. 7, respective head portions 224 of the pins 218 are engaged with respective engage surfaces 264 of the recesses 262, so that the nozzle storing plate 194 is prevented from moving up away from the supporting member 204. As shown in FIG. 7, a fastening device 230 is provided on the supporting member 204. The fastening device 230 includes an engaging member 240 which is engaged with an engaging portion 272 of an engaging member 268 fixed to the nozzle storing plate 194, and a compression coil spring 242 which biases the engaging member 240 in a direction in which the storing plate 194 is attached to the supporting member 204. An operator can manually unfasten the fastening device 230 and detach the storing plate 194 from the supporting member 204. A plurality of suction nozzles 90 stored by one nozzle storing plate 194 can be simultaneously exchanged with a plurality of suction nozzles 90 stored by another nozzle storing plate 194, by exchanging the one plate 194 with the another plate 194. Since the exchange of nozzle storing plates 194 is not relevant to the present invention, no further description thereof is provided.

As shown in FIGS. 10, 11, and 12, the nozzle storing plate 194 is provided with a thin, nozzle-removal inhibiting plate 280 which covers the nozzle storing holes 250 and which is movable along a plane parallel to the plane of the storing plate 194. The inhibiting plate 280 has four openings 282 which are formed through the thickness thereof and which extend parallel to one another in a lengthwise direction thereof. Each of the four openings 282 includes a plurality of circular holes 284 and a plurality of connection holes 286 each of which connects its adjacent two circular holes 284 to each other. The circular holes 284 have a diameter slightly larger than that of the large-diameter portions 256 of the nozzle storing holes 250. The circular holes 284 are formed, in the lengthwise direction of the plate 280, at a regular interval equal to that at which the storing holes 250 are formed in the lengthwise direction of the storing plate 194. The connection holes 286 have a width which is larger than the largest diameter of the tapered portions 136 of the suction nozzles 90 and is smaller than the diameter of the light emitting plates 146. The width of the holes 286 is defined as a dimension in the widthwise direction of the plate 280. Each of the connection holes 286 is defined by a pair of projections which provide a pair of nozzle-removal preventing portions 288 of the plate 280. The two nozzle-removal preventing portions 288 of each pair are distant from, and opposed to, each other in the Y-axis direction, i.e., in the widthwise direction of the plate 280, i.e., in the widthwise direction of the storing-plate supporting member 204. The four openings 282 are formed at a regular interval equal to that at which the nozzle storing holes 250 are formed in the widthwise direction of the storing plate 194.

Figure 13:
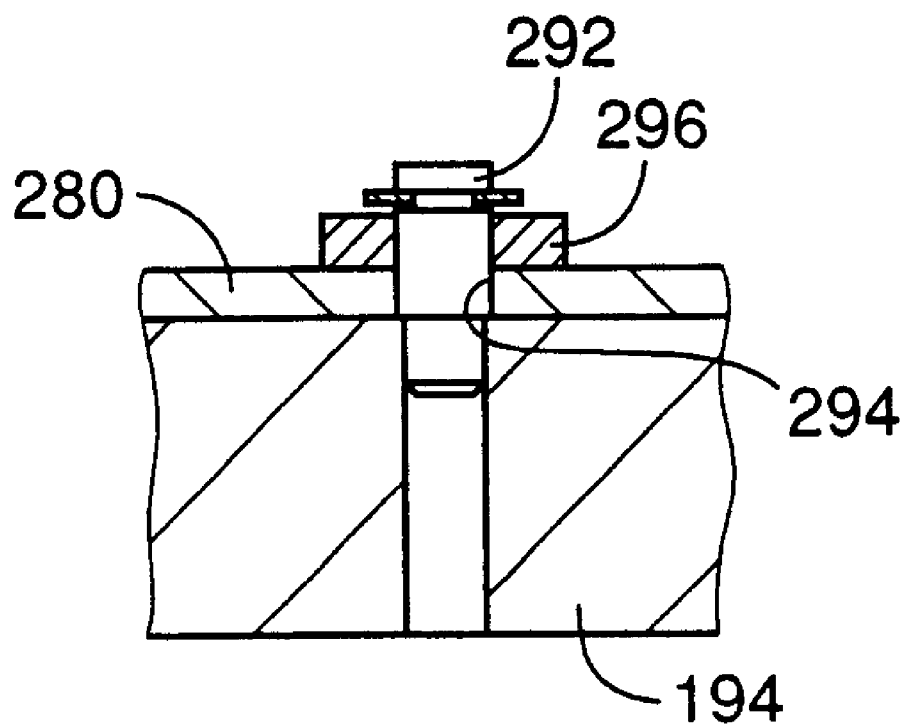
FIG. 13 is a cross-sectioned, side elevation view of a pin which projects from the nozzle storing plate and which is fitted in an elongate hole of the nozzle-removal inhibiting plate.

As shown in FIGS. 10, 11, and 13, a plurality of pins 292 project from the nozzle storing plate 194. Those pins 292 provide engaging projections. The nozzle-removal inhibiting plate 280 has a plurality of elongate holes 294 as engaging recesses that are parallel to the lengthwise direction of the plate 280. The pins 292 are fitted in the elongate holes 294, respectively, such that the plate 280 is movable relative to the storing plate 194. Reference numeral 296 designates a washer, in FIG. 13. The pins 292 fitted in the elongate holes 294 guide the movement of the plate 280 relative to the storing plate 194, and inhibit the plate 280 from being rotated about an axis line perpendicular to the supported surface 252. The pins 292 and the elongate holes 294 cooperate with each other to provide not only a guiding device but also a rotation inhibiting device.

As shown in FIGS. 11 and 12, a tension coil spring 300 as a spring member as an elastic member as a sort of biasing device or member is provided between the nozzle storing plate 194 and the nozzle-removal inhibiting plate 280, such that the coil spring 300 connects the two plates 194, 280 to each other. The limit of movement of the plate 280 owing to the biasing force of the coil spring 300 is defined by butting of the elongate holes 294 against the pins 292. Thus, the pins 292 function as stoppers. In the state in which respective upstream-side ends of the elongate holes 294 as seen in the direction of movement of the plate 280 relative to the storing plate 194 are held in butting contact with the corresponding pins 292 because of the biasing force of the coil spring 300, as shown in FIG. 10, the pairs of nozzle-removal inhibiting portions 288 of the plate 280 are positioned right above the nozzle storing holes 250, respectively, and are engaged with the reflecting surfaces 148 of the light emitting plates 146 of the suction nozzles 90, so as to inhibit the nozzles 90 from being removed from the nozzle storing plate 194. This state corresponds to an operative position of the plate 280. In the present embodiment, the reflecting surfaces 148 of the light emitting plates 146 of the suction nozzles 90 provide respective shoulder surfaces facing toward the side of the tapered portions 136.

As shown in FIGS. 10, 11, and 12, the nozzle-removal inhibiting plate 280 includes a projecting portion 306 which projects from an upstream-side end of the plate 280 as seen in the direction of movement of the plate 280 because of the biasing force of the tension coil spring 300. A free end portion of the projecting portion 306 provides an engaging portion 308 which projects toward the nozzle storing plate 194.

As shown in FIG. 6, an air cylinder 312 as a pressurized-fluid-operated cylinder device as a sort of pressurized-fluid-operated actuator as a drive source is fixed to the storing-plate supporting member 204. An engaging member 316 having a recess 318 is fixed to a piston rod 314 of the air cylinder 312. The engaging portion 308 of the nozzle-removal inhibiting plate 280 is fitted in the recess 318 such that the engaging portion 308 is movable relative to the recess 318. Thus, the recess 318 is a sort of engaging portion. As shown in FIGS. 6 and 10, the recess 318 is formed through the thickness of the engaging member 316 in a direction which is perpendicular to the direction of advancing and retracting movement of the piston rod 314 and is parallel to the direction in which the storing plate 194 is attached to the supporting member 204 (i.e., in the widthwise direction of the supporting member 204). As shown in FIG. 10, two pairs of opposed surfaces each pair of which define a corresponding one of lengthwise opposite end portions of the recess 318 are so inclined that the width of the each end portion of the recess 318 increases in a direction toward a corresponding one of opposite side surfaces of the engaging member 316. The two pairs of opposed surfaces provide two pairs of guide surfaces 320.

The air cylinder 312 is attached to the storing-plate supporting member 204 at a position which assures that the engaging portion 308 and the recess 318 are engaged with each other in the state in which the nozzle-removal inhibiting plate 280 is held at its operative position and the piston rod 314 is held at its retracted position. However, since the two pairs of guide surfaces 320 are formed in the lengthwise opposite end portions of the recess 318, respectively, the engaging portion 308 can be engaged with the recess 318 by being guided by the guide surfaces 320, even though the engaging portion 308 may not be accurately aligned with the recess 318 in the lengthwise direction of the plate 280, i.e., in the direction of movement of the plate 280 relative to the storing plate 194. The air cylinder 312 is attached to the supporting member 204, with a bias toward a misalignment of the recess 318 relative to the engaging portion 308 in a direction opposite to a direction toward the supporting member 204, i.e., opposite to a biasing direction of the tension coil spring 300.

When a solenoid-operated direction control valve 322 (FIG. 14) is switched, two air chambers of the air cylinder 312 are communicated with the atmosphere and the pressurized-air supply source, respectively, so that the piston rod 314 is advanced or retracted and the engaging member 316 is moved. Consequently the nozzle-removal inhibiting plate 280 is moved, in a direction parallel to the PCB-convey direction, between its operative position, shown in FIG. 10, where the inhibiting portions 288 engage the light emitting plates 146 of the suction nozzles 90 fitted in the nozzle storing holes 250, and its inoperative position, shown in FIG. 11, where the circular holes 284 of the openings 282 are substantially aligned with the nozzle storing holes 250. The nozzle-removal inhibiting plate 280 is moved by the air cylinder 312 to its inoperative position against the biasing force of the tension coil spring 300. In the state in which the inhibiting plate 280 is held at its inoperative position, the inhibiting portions 288 allow each of the suction nozzles 90 to be stored in, and removed from, the nozzle storing device 190 in directions parallel to the axis line of the each nozzle 90. This state can be said as a permitting state. On the other hand, in the state in which the inhibiting plate 280 is held at its operative position, the inhibiting portions 288 engage the reflecting surfaces 148, thereby inhibiting the suction nozzles 90 from being removed from the nozzle storing holes 250. The latter state can be said as an inhibiting state. In the present embodiment, the circular holes 284 provide a plurality of through-holes which correspond to the nozzle storing holes 250, respectively, and each of which permits the portion of the corresponding suction nozzle 90 between its free end and its reflecting surface 148 to be passed therethrough in its axial direction. The nozzle-removal inhibiting plate 280 provides a nozzle-removal inhibiting member; and the air cylinder 312 provides a nozzle-removal-inhibiting-member moving device, which cooperates with the plate 280 to provide a permitting and inhibiting device.

When the nozzle storing plate 194 is removed from the storing-plate supporting member 204, the compression coil spring 300 biases the nozzle-removal inhibiting plate 280 toward its operative position, thereby keeping the plate 280 in the state in which the plate 280 inhibits the removal of the suction nozzles 90 from the nozzle storing plate 194. The engaging member 316 is provided with a pair of guide members which are fitted in a pair of guide bushings, respectively, with which the air cylinder 312 is provided. The pair of guide members and the pair of guide bushings cooperate with each other to guide the movement of the engaging member 316 relative to the air cylinder 312 and inhibit the rotation of the member 316.

The nozzle-presence sensor 392 provided at a position on the X-axis slide 54 that corresponds to the EC-suck-and-mount position, identifies whether an EC suction nozzle 90 is stored in each of the nozzle storing holes 250 of the nozzle storing plate 194. When one nozzle holder 152 being stopped at the EC-suck-and-mount position is moved, for exchanging the current nozzle 90 with another nozzle 90, to a position above an appropriate one of the nozzle storing holes 250 of the nozzle storing plate 194, the nozzle storing plate 194 and the storing-plate supporting member 204 are held at their lower end positions. If the one nozzle storing hole 250 is holding one suction nozzle 90, the light emitting portion 400 of the nozzle-presence sensor 392 emits a light toward a portion of the reflecting surface 148 of the light emitting plate 146 of the one nozzle 90 that is not covered with the pair of nozzle-removal inhibiting portions 288 of the plate 280 being positioned at its operative position, and the light receiving portion 402 receives the light reflected from that portion of the reflecting surface 148. The one nozzle 90 held by the nozzle holder 152 being positioned at the EC-suck-and-mount position does not interrupt the light emitted from the light emitting portion 400 toward the reflecting surface 148, or the light reflected from the reflecting surface 148 toward the light receiving portion 402.

If the one nozzle storing hole 250 holds one EC suction nozzle 90 stored therein, the light emitted from the light emitter 400 is reflected by the reflecting surface 148, and then is received by the light receiver 402. Accordingly, the amount of light received by the light receiver 402 exceeds a predetermined threshold value. Thus, the control device 330 (FIG. 14) recognizes that the one nozzle storing hole 250 holds one EC suction nozzle 90. However, if not, the light emitted from the light emitter 400 is incident to the large-diameter portion 256 of the one nozzle storing hole 250. Since the nozzle storing plate 194 is colored in black, the amount of light reflected from the portion 256 is small and the amount of light received by the light receiver 402 cannot exceed the threshold value. Thus, the control device 330 recognizes that the one nozzle storing hole 250 stores no EC suction nozzle 90, i.e. is empty.

In the present EC mounting system 10, the two EC supplying devices 16, 18 and the two EC mounting apparatuses 20, 22 are constructed such that the two devices 16, 18, or the two apparatuses 20, 22, are symmetric with each other with respect to the center line of the PCB conveyor 14 that is parallel to the PCB-convey direction. That is, the two devices 16, 18, or the two apparatuses 20, 22 are oriented to the same direction parallel to the PCB-convey direction. This is true with the two suction-nozzle storing devices 190, 192. That is, the device 192 is symmetric with the above-described device 190.

Figure 15:
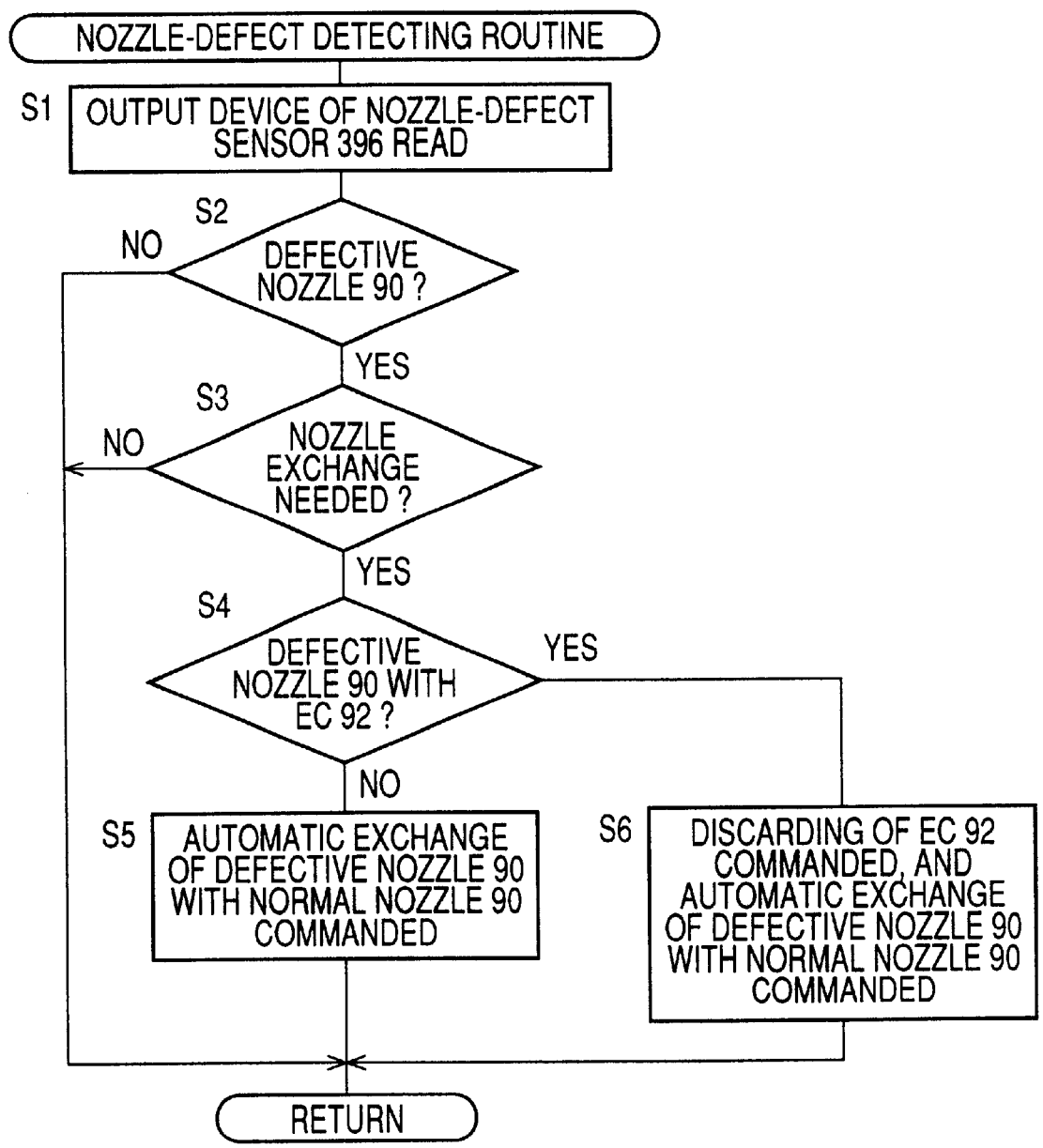
FIG. 15 is a flow chart representing a nozzle-defect detecting routine pre-stored in a read only memory ("ROM") of a computer as the control device of FIG. 14.

The present EC mounting system 10 is controlled by the control device 330 shown in FIG. 14. The control device 330 is essentially constituted by a computer 340 including a processing unit (PU) 332, a read only memory (ROM) 334, a random access memory (RAM) 336, and a bus 338 which connects the elements 332, 334, 336 to one another. An input interface 342 is connected to the bus 338, and the two EC-image taking devices 160, the two reference-mark-image taking devices 162, and the various nozzle sensors 390, 392, 394, 396 (or the respective light receivers thereof) are connected to the input interface 342. The bus 338 is connected to an output interface 346 which in turn is connected via respective drive circuits 345, 347, 348, 350, 352, 354, 356, 357 to the two Y-axis servomotors 65, the two X-axis servomotors 66, the two IR rotating servomotors 76, the two linear servomotors 172, the two solenoid valves 213, the two solenoid valves 322, an alarming device 358, and the two nozzle rotating servomotors 378. The drive circuits 345, 347, 348, 350, 352, 354, 356, 357 cooperate with the computer 340 to provide the control device 330. The alarming device 358 informs the operator of the occurrence of an abnormality. Each of the above-described servomotors 65, 66, 76, 378 is an electric rotary motor as a sort of electric motor as a drive source and is accurately controllable with respect to its rotation angle and speed. Each of the linear motors 172 is a servomotor that is a sort of electric motor as a drive source and is accurately controllable with respect to its moving distance and speed. All those servomotors may be replaced with stepper motors. The control device 330 additionally controls the above-described carry-in-conveyor shifting device, the carry-out-conveyor shifting device, the two main conveyors 24, 26, the carry-in conveyor 28, the carry-out conveyor 30, the respective tape feeding devices of the EC feeders 42, etc., though not shown in FIG. 14. The ROM 334 stores an EC mounting program used for controlling the EC mounting apparatuses 20, 22 to mount ECs 92 on a PCB 32, a nozzle-defect detecting program represented by the flow chart of FIG. 15, and other control programs.

Hereinafter, there will be described the operation of the EC mounting system 10 constructed as described above.

The two EC mounting apparatuses 20, 22 alternately mount, under the control in accordance with the nozzle-defect detecting routine stored in the ROM 334, the ECs 92 on the PCB 32 positioned by either one of the two main conveyors 24, 26. That is, the two apparatuses 20, 22 cooperate with each other to mount, on each single PCB 32, all the ECs 92 that are designed to be mounted on that PCB 32 by the present EC mounting system 10. While the ECs 92 are mounted on one PCB 32 positioned and supported by one of the two main conveyors 24, 26, another or second PCB 32 is carried out from the other main conveyor and a third PCB 32 is carried in onto the other main conveyor and is positioned and supported by the same. The third PCB 32 waits on the other main conveyor, for ECs 92 to be mounted thereon. After all the ECs 86 have been mounted on the first PCB 32 supported on the one main conveyor, the first PCB 32 is carried out from the one main conveyor and the apparatuses 20, 22 start mounting ECs 92 on the third PCB 32 waiting on the other main conveyor.

The two EC mounting apparatuses 20, 22 mount ECs 92 on one or more PCBs 32 in various manners. For example, in the case where the two EC supplying devices 16, 18 are ones which are exclusively used for mounting ECs 92 on a single sort of PCBs 32 and which include same sorts of EC feeders 42, and the two mounting heads 50, 52 carry the greatest possible number of suction nozzles 90 (i.e., sixteen suction nozzles 90 in the present embodiment), the two EC mounting apparatuses 20, 22 may cooperate with each other to mount, while using all the EC feeders 42 of the EC supplying devices 16, 18, a plurality of ECs 92 on each of a predetermined number of PCBs 32 of a single sort, in a corresponding one of a series of EC mounting operations. In this case, the ROM 334 stores an EC-mount control program according to which the EC mounting system 10 mounts the ECs 92 on the PCBs 32.

The first EC mounting apparatus 20 always takes ECs 92 from the first EC supplying device 16, and the second apparatus 22 always takes ECs 92 from the second device 18, but the first apparatus 20 does not take any ECs 92 from the second device 18 and the second apparatus 22 does not take any ECs 92 from the first device 18. The EC taking and mounting operations carried out by the first apparatus 20 will be described below as a representative of those carried out by the two apparatuses 20, 22.

When ECs 92 are taken from the first EC supplying device 16, the IR (intermittent-rotation) body 68 is intermittently rotated, so that the sixteen nozzle holders 152 and the sixteen suction nozzles 90 are sequentially positioned at the EC-suck-and-mount position, while the IR body 68 is moved by the X-Y robot 62 to a position right above the EC-supply portion of an appropriate one of the EC feeders 42. When each nozzle holder 152 reaches the EC-suck-and-mount position, the each holder 152 is positioned right below the drive portion 180 and, in this state, the linear motor 172 is started to lower the movable member 176 and the drive member 178, thereby lowering the drive portion 180 and accordingly lowering the each nozzle holder 152 and the corresponding suction nozzle 90. After the pressure switch valve 96 is switched to its vacuum-supply position and the suction nozzle 90 contacts an EC 92 and sucks the EC 92 by applying vacuum (i.e., negative pressure) thereto, the movable member 176 and the drive member 178 are moved up so that the each nozzle holder 152 is moved up against the biasing force of the compression coil spring 86. Thus, the suction nozzle 90 takes the EC 92 from the one EC feeder 42.

After each of the sixteen EC suction nozzles 90 takes an EC 92 at the EC-suck-and-mount position, the each nozzle 90 reaches the EC-image-take position where the EC-image taking device 160 takes an image of the EC 92 held by the each nozzle 90. Thus, the control device 330 calculates, based on image data representing the taken image of the EC 92, X-axis-direction and Y-axis-direction position errors and rotation-position error of the EC 92 held by the nozzle 90. An ultraviolet-ray emitting device (not shown) is provided at the EC-image-take position, and emits ultraviolet rays toward the light emitting plate 146 of the nozzle 90. The emitting plate 146 absorbs the ultraviolet rays and emits a visible light toward the EC 92 held by the suction pipe 134. After all of the sixteen suction nozzles 90 suck and hold respective ECs 92, the EC mounting head 50 is moved by the X-Y robot 62 to above the PCB 32 and mounts the ECs 92 on the PCB 32. Each of the sixteen nozzle holders 152 is positioned at the EC-suck-and-mount position by the rotation of the IR body 68, and is moved by the X-Y robot 62 to a position right above an EC-mount place on the PCB 32.

During the above-described movement of each nozzle holder 152, the shaft member 84 of the each holder 152 is rotated about its own axis line by the nozzle rotating device 370, so that the suction nozzle 90 carried by the each holder 152 is also rotated about its own axis line to correct the above-indicated rotation-position (i.e., angular) error of the EC 92 held by the nozzle 90. In addition, the current rotation position of the EC 92 held by the nozzle 90 may be changed to a prescribed rotation position. Before the ECs 92 are mounted on the PCB 32, the reference-mark-image taking device 162 takes respective images of the reference marks affixed to the PCB 32, and the control device 330 calculates, based on the taken images, respective X-axis-direction and Y-axis-direction position errors of each of prescribed EC-mount places on the PCB 32. The respective distances of movement of the shaft member 84 of the each nozzle holder 152 in the X-axis and Y-axis directions are modified to correct the respective X-axis-direction and Y-axis-direction position errors of a corresponding one of the prescribed EC-mount places on the PCB 32, and the respective X-axis-direction and Y-axis-direction position errors of the center of the EC 92 held by the shaft member 84. Those position errors of the center of the EC 92 are respective sums of respective X-axis-direction and Y-axis-direction position errors of the center of the EC 92 which are produced when the nozzle 90 held by the each nozzle holder 152 sucks the EC 92, respective X-axis-direction and Y-axis-direction position changes of the center of the EC 92 which are produced when the rotation-position error of the EC 92 is corrected by the rotation thereof, and respective X-axis-direction and Y-axis-direction position changes of the center of the EC 92 which are produced when the current rotation position of the EC 92 is changed to the prescribed rotation position by the rotation thereof. After the above-described movement of each nozzle holder 152, the each holder 152 is lowered by the elevating and lowering device 170, so that the EC 92 is placed on the PCB 32. Subsequently, the pressure switch valve 96 is switched to its EC-release position and the suction nozzle 90 is communicated with the atmosphere, so that the vacuum is cut from the nozzle 90. Thus, the EC 92 is released. After the EC 92 is mounted on the PCB 32, the nozzle holder 152 is elevated. The intermittent rotation of the IR body 68 and the movement of the mounting head 50 are repeated so that all the ECs 92 held by the head 50 are mounted on the PCB 32. Then, the head 50 is moved to the EC supplying device 16 to take additional ECs 92 from the device 16.

Irrespective of whether the EC suction nozzles 90 are receiving or mounting the ECs 90, the control device 33 inspects, based on the signal or output value produced by the nozzle-hold sensor 394, whether one nozzle holder 152 being positioned at the nozzle-hold-inspect position holds one suction nozzle 90. If the amount of light received by the light receiver of the nozzle-hold sensor 394 is not greater than a threshold value, the control device 330 judges that the one holder 90 does not hold the one nozzle 90 and estimates that the one nozzle 90 may have come off the one holder 152 or an abnormality has occurred to the one holder 152. In this case, the control device 330 operates the alarm device 358 to inform the operator of the occurrence of abnormality, and stops at least one of the two EC mounting apparatuses 20, 22 that includes the one holder 152 which has been judged to be without the nozzle 90 or with the abnormality. Thus, the nozzle-hold sensor 394 and the control device 330 cooperate with each other to provide a nozzle-hold inspecting device. As described above, when the control device 330 recognizes the occurrence of abnormality, it not only operates the alarm device 358 to inform the operator of the occurrence of abnormality, but also stops at least one of the two EC mounting apparatuses 20, 22 to which the abnormality has occurred. However, in the following description, only the operation of the alarm device 358 will be referred to for just avoiding redundant description.

In addition, irrespective of whether the EC suction nozzles 90 are taking or mounting the ECs 90, the control device 330 detects a defect of the suction nozzle 90 held by one nozzle holder 152 being stopped at the nozzle-defect-detect position. Each time one nozzle holder 152 is stopped at the nozzle-defect-detect position, the control device 330 identifies whether the one nozzle holder 152 has a defect, according to the nozzle-defect detecting control program or routine represented by the flow chart of FIG. 15. Hereinafter, the nozzle-defect detecting method will be described along the steps of the nozzle-defect detecting control routine.

At Step S1 of the nozzle-defect detecting control routine, the control device 330 reads an output value of the nozzle-defect sensor 396, i.e., an amount of light received by the light receiver 408 of the sensor 396. Step S1 is followed by Step S2 to judge, based on the read output value, whether one suction nozzle 90 is a defective nozzle having a defect. Before one nozzle holder 152 and one suction nozzle 90 held thereby is moved to the nozzle-defect-detect position, the light receiver 408 of the nozzle-defect sensor 396 receives the light emitted by the light emitter 406 thereof. Once one holder 152 and one nozzle 90 are stopped at the nozzle-defect-detect position, the suction pipe 134 of the one nozzle 90 reflects the light, thereby preventing the receiver 408 from receiving the light. However, if the pipe 134 has been broken or curved and cannot reflect the light, the receiver 408 receives the light. Thus, based on the facts that one holder 152 and one nozzle 90 are stopped at the nozzle-defect-detect position and that the amount of light received by the receiver 408 exceeds a threshold value, the control device 330 can identify that the one nozzle 90 is a defective nozzle which has been broken or curved. Since a value near zero is selected as the threshold value, the amount of light received by the receiver 408 easily exceeds the threshold value and the curved nozzle 90 is detected, even if the amount of curving of the nozzle 90 is considerably small. Since the light emitter 406 of the nozzle-detect sensor 396 emits the light toward the suction pipe 134, the curving or breaking of the nozzle 90 can be detected even if the nozzle 90 may not hold the EC 92.

As described above, the width of cross section of the belt-like light emitted by the light emitter 406 of the nozzle-defect sensor 396 is slightly smaller than the smallest one of the respective diameters of the different sorts of suction pipes 134. Therefore, the sensor 396 can detect curving of each of the smallest pipe 134 having the smallest diameter and several small sorts of pipes 134 having respective small diameters near the smallest diameter.

In the case where the width of cross section of the light emitted by the light emitter 406 is smaller than the diameter of a suction pipe 134 but sufficiently near to the diameter, a small amount of curving of the pipe 134 can be detected because the amount of light received by the receiver 408 exceeds the threshold value near zero. In the case where the width of cross section of the light is great for detecting curving of a pipe 134 having a great diameter, curving of a pipe 134 having a small diameter cannot be detected because the small-diameter pipe 134 remains in the path of travelling of the light, irrespective of whether the pipe 134 is curved or not, and accordingly the amount of light received by the receiver 408 does not change. On the other hand, in the case where the width of cross section of the light is small, curving of a pipe 134 having a great diameter cannot be detected because the great-diameter pipe 134 reflects the light, irrespective of whether the pipe 134 is curved or not, and accordingly the amount of light received by the receiver 408 does not change. Meanwhile, there is a fact that pipes 134 having small diameters are more likely curved than pipes having great diameters. Hence, in the present embodiment, the width of cross section of the light emitted by the light emitter 406 is small, for the purpose of detecting curving of each of several small sorts of pipes 134 having respective small diameters. The nozzle-defect sensor 396 can easily detect breaking of the suction pipe 134, irrespective of whether the diameter of the pipe 134 is small or great, because the amount of light received by the receiver 408 exceeds the threshold value in each case.

As described above, each suction nozzle 90 can be rotated, by the nozzle rotating device 370, about its axis line to change the current rotation position of the EC 92 held thereby and/or correct a rotation-position error of the EC 92. Therefore, when the sixteen nozzles 90 are sequentially stopped at the nozzle-defect-detect position, the different nozzles 90 may have different rotation positions. If one nozzle 90 stopped at the nozzle-defect-detect position is curved in a direction parallel to an optical axis of the nozzle-defect sensor 396, the sensor 396 cannot detect the curving of the one nozzle 90. However, if the current rotation position of the one nozzle 90 is changed by the nozzle rotating device 370, the curving of the one nozzle 90 is deviated from the optical axis and accordingly can be detected by the sensor 396. Since rotating the one nozzle 90 about its axis line or changing the rotation position of the one nozzle 90 is equivalent to emitting a light toward the one nozzle 90 from each of a plurality of nozzle-defect sensors provided around the one nozzle 90. Thus, the curving of the one nozzle can be detected.

Thus, the control device 330 judges, based on the amount of light received by the light receiver 408, whether the suction pipe 134 has been broken or curved. If the amount of light received by the receiver 408 is smaller than the threshold value, the control device 330 judges that the pipe 134 has not been broken or curved and that the suction nozzle 90 is not a defective nozzle. Hence, the control device 330 makes a negative judgment at Step S2, and terminates the current control cycle according to the control routine of FIG. 15. Thus, Step S2 corresponds to a nozzle-defect detecting step.

If the suction pipe 134 is a broken or curved pipe, the amount of light received by the light receiver 408 exceeds the threshold value. Therefore, the control device 330 judges that the suction nozzle 90 is a defective nozzle and makes a positive judgement at Step S2. Hence, Step S2 is followed by Step S3 to judge whether the defective nozzle 90 needs to be exchanged with a normal one. For example, if the amount of curving of the nozzle 90 is considerably small and the curved nozzle 90 can be used to hold and mount an EC 92, the nozzle 90 need not be exchanged with a normal one, i.e., can be used to suck and hold another EC 92. On the other hand, if the pipe 134 is a broken pipe, the defective nozzle 90 needs to be exchanged with a normal one to prevent it from sucking and holding another EC 92. Thus, that the amount of curving of the nozzle 90 is great or that the nozzle 90 has been broken is a predetermined condition for the defective nozzle 90 to be exchanged with a normal one to prevent it from holding and sucking any other EC 92.

The amount of curving of the suction pipe 134 can be measured based on the amount of light received by the light receiver 408. Therefore, the control device 330 judges whether the defective nozzle 90 needs to be exchanged with a normal one, by comparing the amount of fight received by the receiver 408 with a threshold value. This second threshold value is greater than the first threshold value employed at Step S2 to judge whether one suction nozzle 90 is a defective nozzle. If the amount of light received by the receiver 408 is smaller than the second threshold value, the control device 330 judges that the amount of curving of the pipe 134 is not great so much and the pipe 134 need not be exchanged, and makes a negative judgment at Step S3. Thus, the current control cycle is terminated.

On the other hand, if the amount of light received by the receiver 408 is greater than the second threshold value, the control device 330 judges that the amount of curving of the pipe 134 is great and the pipe 134 needs to be exchanged, and makes a positive judgment at Step S3. Likewise, in the case where the suction pipe 134 has been broken, the amount of light received by the receiver 408 is greater than the second threshold value, and a positive judgment is made at Step S3. Step S3 is followed by Step S4 to judge, from the EC mounting control program, whether the defective nozzle 90 must currently hold an EC 92. If not, a negative judgment is made at Step S4, and the control goes to Step S5 to command an automatic exchange of the defective nozzle 90 with a normal one.

On the other hand, if a positive judgment is made at Step S4, the control of the control device 330 goes to Step S6 to command the defective nozzle 90 to discard the EC 92 and additionally command an automatic exchange of the defective nozzle 90 with a normal one. Although not shown, an EC collecting box for collecting the ECs 92 discarded by the defective nozzles 90 is provided within a range in which the EC mounting head 50, 52 is moved by the X-Y robot 62, 64. The defective nozzle 90 holding the EC 92 is moved to a position above the EC collecting box and discards the EC 92 into the box. Then, the defective nozzle 90 is automatically exchanged with a normal one.

In response to the command issued at Step S5 or S6, the defective nozzle 90 is automatically exchanged with a normal one. This step corresponds to a nozzle exchanging step. Irrespective of whether the defective nozzle 90 currently holds an EC 92, the defective nozzle 90 is exchanged with a normal one, before the defective nozzle 90 holds another EC 92, that is, while suspending the series of EC mounting operations.

Hereinafter, the nozzle exchange will be described in detail.

When one suction nozzle 90 is exchanged, the nozzle holder holding the one nozzle 90 is moved to the EC-suck-and-mount position by the intermittent rotation of the IR body 68, and is moved by the X-Y robot 62 to a position right above an appropriate one of the empty nozzle storing holes 250. During this movement of the nozzle holder 152, the nozzle storing plate 194 is held at its lower end position. After the movement of the nozzle holder 152, the storing-plate supporting member 204 is elevated so that the storing plate 194 is elevated to its upper end position.

Before the nozzle storing plate 194 is elevated, the nozzle-presence sensor 392 is used to identify whether the above-described appropriate one nozzle storing hole 250 is actually empty. If a positive judgment is made, the one nozzle 90 held by the nozzle holder 152 is returned to the empty hole 250 of the storing plate 194. However, if a negative judgment is made, the current nozzle exchanging operation is terminated, and the control device 330 operates the alarming device 358 to generate an alarm sound to inform the operator of the occurrence of an abnormality. Thus, the present EC mounting apparatus 20 can prevent the nozzle storing plate 194 from being elevated when the one hole 250 is not actually empty, and thereby prevents the one nozzle 90 held by the shaft member 84 and the nozzle 90 held by the one hole 250, from colliding with, and being damaged by, each other.

If the above-indicated appropriate one hole 250 is empty, the nozzle storing plate 194 is allowed to be elevated. After the nozzle storing plate 194 is elevated, the nozzle holder 152 is lowered by the elevating and lowering device 170, so that the suction pipe 134 of the suction nozzle 90 held by the holder 152 is fitted in the small-diameter portion 254 of the above-indicated one empty hole 250. In this state, the nozzle-removal inhibiting plate 280 is held at its operative position, and the light emitting plate 146 of the nozzle 90 is positioned at a height position slightly higher than that of the inhibiting plate 280.

After the suction pipe 134 is fitted in the small-diameter portion 254, the nozzle-removal inhibiting plate 280 is moved to its inoperative position by the air cylinder 312. Subsequently, the nozzle holder 152 is further moved downward by the elevating and lowering device 170 so that the light emitting plate 146 is fitted in the large-diameter portion 256. The distance of the downward movement of the nozzle holder 152 is determined by adding an additional value to the distance between the plate 146 and the portion 256. The additional value is predetermined by taking into account the manufacturing errors of, e.g., the suction-nozzle storing device 190, and other factors. Any excessive downward movement of the nozzle holder 152 is accommodated by compression of the compression coil spring 108. After the downward movement of the holder 152, the nozzle-removal inhibiting plate 280 is returned to its operative position by the air cylinder 312, and the drive member 178 is moved to a position, e.g., its upper end position, where the nozzle 90 is allowed to be removed from the holder 152, so that the holder 152 is moved upward to its upper end position. During this upward movement of the holder 152, a relevant pair of nozzle-removal inhibiting portions 288 of the plate 280 engage the light emitting plate 146, thereby inhibiting the nozzle 90 from being removed from the nozzle storing plate 194. More specifically described, since the pair of nozzle-removal inhibiting portions 288 apply, to the nozzle 90, a force greater than the drawing force of the spring member 140 to draw the nozzle 90 into the adaptor 100, i.e., the holding force of the adaptor 100 to hold the nozzle 90, in a direction in which the nozzle 90 is moved away from the adaptor 100, the nozzle 90 is removed from the adaptor 100 and is stored by the nozzle storing plate 194.

Thus, one nozzle holder 152 positioned at the EC-suck-and-mount position returns the defective nozzle 90 to the nozzle storing plate 194, and becomes empty. Therefore, when the one holder 152 is returned to its upper end position, the nozzle-exchange sensor 390 does not detect a suction nozzle 90 and accordingly the control device 330 recognizes that the defective nozzle 90 has been returned to the nozzle storing plate 194. That is, based on the facts that the one nozzle holder 152 is lowered and then elevated to return the defective nozzle 90 to the nozzle storing plate 194 (for example, the one holder 152 is lowered and then elevated for the first time after the one holder 152 is stopped at the EC-suck-and-mount position) and that the nozzle-exchange sensor 390 does not detect a nozzle 90, the control device 330 can judge that the defective nozzle 90 has been returned to the nozzle storing plate 194. However, if the nozzle-exchange sensor 390 detects a nozzle 90 after the one holder 152 is lowered and elevated to return the defective nozzle 90 to the nozzle storing plate 194, the control device 330 recognizes that the defective nozzle 90 has not been returned to the nozzle storing plate 194 because of the occurrence of some abnormality. In the latter case, the control device 330 commands the alarming device 358 to generate an alarm sound to inform the operator of the occurrence of abnormality.

After the one nozzle holder 152 returns the EC suction nozzle 90 to the nozzle storing plate 194 in this way, the storing plate 194 is moved downward to its lower end position. After this downward movement of the storing plate 194, the empty holder 152 which has returns the defective nozzle 90 to the storing plate 194, is moved by the X-Y robot 62 to a position right above one of the nozzle storing holes 250 that should currently hold a normal nozzle 90 of the same sort as that of the defective nozzle 90.

After the above-described movement of the nozzle holder 152, and before the nozzle storing plate 194 is elevated, the nozzle-presence sensor 392 detects or judges whether the above-indicated one hole 250 is actually holding the normal nozzle 90 to be next held by the holder 152. If a negative judgment is made, the current nozzle exchanging operation is terminated, and the control device 330 operates the alarming device 358 to generate an alarm sound to inform the operator of the occurrence of abnormality. Thus, the nozzle-presence sensor 392 provides a device which identifies whether a suction nozzle 90 is present or absent in a nozzle storing hole 250.

On the other hand, if a positive judgment is made, the nozzle storing plate 194 is moved upward to its upper end position. After the nozzle storing plate 194 is moved upward, the nozzle holder 15 is moved downward so that the tapered portion 136 of the normal nozzle 90 stored by the storing plate 194 is fitted in the tapered hole 138 of the adaptor 100 carried by the holder 152. The distance of the downward movement of the holder 152 is determined by adding an additional value to the distance needed for the tapered portion 136 to be fitted in the tapered hole 138. The additional value is predetermined by taking into account the manufacturing errors of, e.g., the suction-nozzle storing device 190, and other factors. Thus, the tapered portion 136 is reliably fitted in the tapered hole 138 and is reliably held by the spring member 140. Any excessive downward movement of the holder 152 is accommodated by compression of the compression coil spring 108.

After the tapered portion 136 is fitted in the tapered hole 138, the nozzle-removal inhibiting plate 280 is moved to its inoperative position. Subsequently, the nozzle holder 152 is moved upward to its upper end position, and the normal nozzle 90 is removed from the nozzle storing plate 194. Then, the plate 280 is moved to its operative position, and the storing plate 194 is moved downward to its lower end position in the state in which the nozzles 90 stored by the storing plate 194 are inhibited from jumping off the same 194. When the nozzle holder 152 reaches its upper end position, the control device 330 identifies whether the holder 152 holds the normal nozzle 90, depending upon whether the nozzle-exchange sensor 390 detects the nozzle 90. Based on the facts that the holder 152 has been moved to suck and hold the normal nozzle 90 (e.g., the holder 152 has been lowered and elevated for the second time at the EC-suck-and-mount position) and that the sensor 390 has detected the nozzle 90, the control device 330 recognizes that the holder 152 has taken the nozzle 90 from the nozzle storing plate 194. However, if the sensor 390 does not detect the nozzle 90, the control device 330 judges that the holder 152 failed to hold the normal nozzle 90, and operates the alarming device 358 to generate an alarm sound to form the operator of the occurrence of abnormality. Thus, the nozzle-exchange sensor 390 provides a device which identifies whether each nozzle holder 152 has exchanged a defective nozzle 90 with a normal nozzle 90.

After the defective nozzle 90 has been exchanged with a normal one 90, the EC mounting apparatus 20 returns to the EC mounting operation that has been suspended during the nozzle exchange. The EC mounting apparatus 20 automatically detects a defect of each of the sixteen suction nozzles 90 and, if a defective nozzle 90 needs to be exchanged, the apparatus 20 automatically exchanges the defective nozzle 90 with a normal one to prevent the defective nozzle 90 from sucking and holding any additional EC 92. Thus, the apparatus 20 minimizes the decrease of the EC mounting efficiency.

A conventional EC mounting machine including a plurality of suction nozzles of a same sort is operated, when one of the nozzles becomes defective, such that the defective nozzle is no longer used and only the other normal nozzles are used to mount ECs on a PCB and such that an alarm such as a buzzer is issued to inform an operator of the occurrence of nozzle defect so that when the operator notices it, he or she manually exchange the defective nozzle with a normal one. However, since the defective nozzle is no longer used, the number of nozzles used to mount ECs decreases, which leads to increasing the number of reciprocative movements of an EC mounting head between the PCB and an EC supplying device, i.e., increasing the time needed to mount the ECs, which in turn decreases the EC mounting efficiency. In the case where all the suction nozzles of an EC mounting machine are of a same sort, the mounting machine can continue, when one of the nozzles becomes defective, an EC mounting operation, with a small increase of the number of reciprocative movements of its EC mounting head between a PCB and its EC supplying device. On the other hand, in the case where an EC mounting machine employs different sorts of suction nozzles including just one suction nozzle for each sort, the mounting machine cannot continue, if the single suction nozzle of each sort becomes defective, an EC mounting operation, which leads to largely decreasing the EC mounting efficiency. In the third case where an EC mounting machine employs different sorts of suction nozzles including two suction nozzles for each sort, the number of reciprocative movements of its EC mounting head between a PCB and its EC supplying device is doubled, if one of the two suction nozzles for each sort becomes defective, which results in lowering the EC mounting efficiency. The smaller the number of suction nozzles of a same sort is, the more the EC mounting efficiency decreases. In addition, it is cumbersome and time-consuming (more than 30 seconds are consumed) for the operator to manually exchange a defective nozzle with a normal one, which results in considerably decreasing the EC mounting efficiency.

In contrast thereto, the present EC mounting apparatus 20, 22 automatically detects a defective nozzle 90 and automatically exchanges the defective nozzle 90 with a normal one. This nozzle exchange is easily and quickly performed without needing any intervention of the operator. In addition, since the defective nozzle 90 is exchanged with a normal one before sucking and holding any additional EC 92, all the pre-programmed number of suction nozzles 90 are always used to mount ECs 92, while avoiding the problem that the EC mounting efficiency would be largely decreased by letting the defective nozzle 90 remain of no use. One nozzle exchange increases, by only about 3 seconds, the time needed to mount ECs 92 on a PCB 32. The less the number of suction nozzles of a same sort is, the more the decrease of the EC mounting efficiency is lowered.

As is apparent from the foregoing description, in the present embodiment, the EC mounting apparatus 20, 22 is of a type which simultaneously transfers a plurality of ECs 92; and the light emitter 406 and the light source of the nozzle-defect sensor 396 provide a beam emitting device, and the light receiver 408 and the light detecting elements of the sensor 396 provide a beam detecting device. The X-axis slide 54, 56 and the Y-axis slide 58, 60 cooperate with each other to provide a movable member; and the X-axis-slide moving device 71, the Y-axis-slide moving device, and the IR-body rotating device 78 cooperate with one another to provide an EC-transfer moving device which moves the suction nozzles 90 to transfer the ECs 92 held by the nozzles 90. The IR-body rotating device 78 also provides a defect-detect nozzle moving device as a sort of defect-detect moving device, and cooperates with the nozzle-defector sensor 396 to provide a nozzle-defect detecting device. The X-Y robot 62, 64 and the elevating and lowering device 170 cooperate with the air cylinder 200 as part of a nozzle-storing-plate elevating and lowering device as a nozzle-storing-member elevating and lowering device as a sort of nozzle-storing-member moving device, to provide a nozzle-exchange moving device on one hand, and cooperate with the nozzle storing device 190, 192, the nozzle holders 152, the nozzle-removal inhibiting plate 280, and the air cylinder 312 to provide a nozzle exchanging device. A portion of the control device 330 that controls the nozzle exchanging device to perform a nozzle exchange provides a nozzle-exchanging-device control device; and a portion of the control device 330 that carries out Step S3 provides a judging device which judges whether it is needed to exchange instantly a defective nozzle with a normal one.

The control device 330 may be adapted to store, when defective nozzles 90 are detected, history data relating to the detection of defective nozzles 90. For example, the control device 330 may store, in a memory such as the RAM 336 of the computer 340, data indicating the sort of each defective nozzle 90, the position where each defective nozzle 90 is held on the IR body 68, and the number of ECs 92 each defective nozzle 90 has mounted.

When a defective nozzle 90 is detected, the defective nozzle 90 is automatically exchanged with a normal one. The control device 330 may be adapted to inform, at this time, the operator of the automatic exchange of the defective nozzle 90 with the normal one.

While the present invention has been described in its preferred embodiment, the invention may otherwise be embodied.

Figure 16:
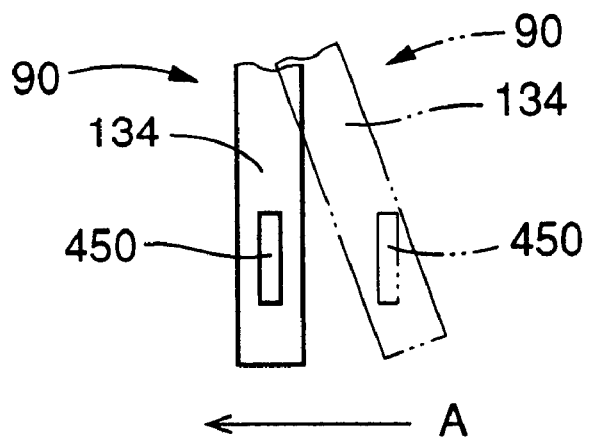
FIG. 16 is a view for explaining an operation of a nozzle-defect detecting device of another EC mounting apparatus as a second embodiment of the present invention.
Figure 17:
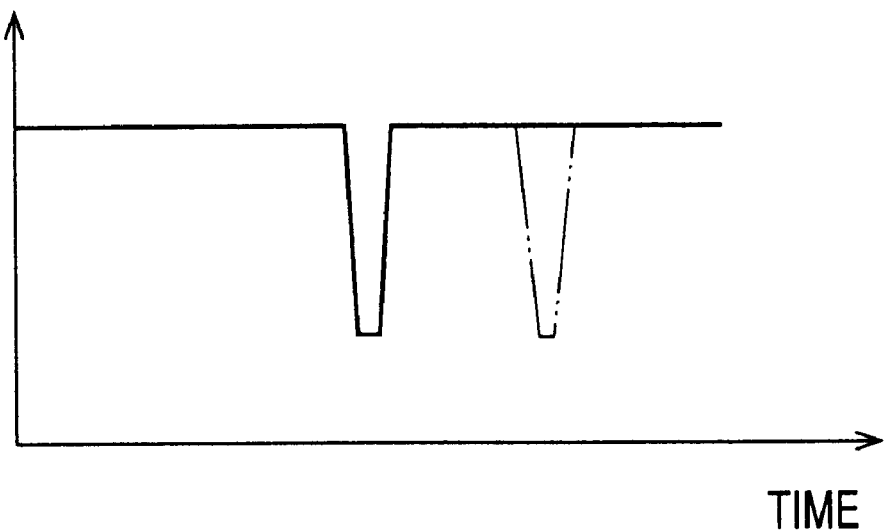
FIG. 17 is a graph for explaining the manner in which the nozzle-defect detecting device of FIG. 16 detects a defect of a suction nozzle.

For example, in the above-described first embodiment, the EC mounting apparatus 20, 22 detects a defect of each suction nozzle 90 in the state in which the each nozzle 90 is stopped at the nozzle-defect-detect position. However, it is possible to detect a defect of each suction nozzle 90 while the each nozzle 90 and a nozzle-defect sensor are moved relative to each other. FIGS. 16 and 17 show a second embodiment of the present invention in which a defect of each suction nozzle 90 is detected while the each nozzle 90 is moved relative to a nozzle-defect sensor (not shown). In this embodiment, the nozzle-defect sensor is provided at a position which is located between two adjacent stop positions of the sixteen stop positions of the each nozzle 90 and through which the each nozzle 90 is passed (i.e., revolved) at a substantially constant velocity. This position corresponds to the nozzle-defect-detect position. The nozzle-defect sensor may be provided by a transmission-type photoelectric sensor including a light emitter and a light receiver. A width of cross section of a light 450 which is emitted by the light emitter toward the light receiver is smaller than the smallest one of the respective diameters of the different sorts of suction pipes 134. The nozzle-defect sensor is disposed such that an optical axis of the sensor intersects the path of revolution of each suction pipe 134.

In the state in which the suction nozzle 134 has not reached the nozzle-defect-detect position, the light 450 emitted by the light emitter of the nozzle-defect sensor is received by the light receiver. When the nozzle 134 reaches the nozzle-defect-detect position, the light 450 emitted by the light emitter is interrupted by the nozzle 134 and is not received by the light receiver. Irrespective of whether the pipe 134 is curved or straight, the light receiver cannot receive the light 450 when the pipe 134 passes through the nozzle-defect-detect position. However, as shown in the graph of FIG. 17, a timing at which the amount of light received by the light receiver decreases when the defective, curved pipe 134 passes differs from a timing at which the amount of light received by the light receiver decreases when the normal, straight pipe 134 passes. In the case where the pipe 134 is normal and straight as indicated at solid line in FIG. 16, the amount of light received by the light receiver decreases at an expected timing. However, in the case where the pipe 134 is defective and curved toward its upstream side as seen in a nozzle-move direction, A, as indicated at two-dot chain line in FIG. 16, the amount of light received by the light receiver decreases at a delayed timing. Thus, the control device 330 can identify that the pipe 134 is curved. In the case where the pipe 134 is broken, the amount of light received by the light receiver never decreases. Thus, the control device 330 can identify that the pipe 134 is broken.

Since the width of cross section of the light 450 emitted by the light emitter is smaller than the smallest one of the respective diameters of the different sorts of suction pipes 134, the present EC mounting apparatus can detect curving of every sort of pipe 134 irrespective of its diameter. In the case where a defect of a nozzle is detected in the state in which the nozzle is stopped, curving of a certain sort of pipe having a certain diameter can be detected with a light having a prescribed width, but curving of a different sort of pipe having a different diameter may not be detected with the same light, as explained previously. In contrast, in the second embodiment, a defect of each suction nozzle 90 is detected while the each nozzle 90 and the nozzle-defect sensor are moved relative to each other. Therefore, irrespective of whether the diameter of each suction pipe 134 is small or great, the each pipe 134 prevents the light receiver from receiving the light 450 having a width smaller than the smallest one of the respective diameters of the different sorts of suction pipes 134, and can be detected with the light. If the each pipe 134 is curved, a timing at which the curved pipe 134 is detected is deviated from that at which the normal pipe 134 is detected. Thus, the control device 330 can identify the curving of the pipe 134. The IR-body rotating device 78 which rotates the IR body 68 about its axis line and revolves the suction nozzles 90 about the axis line, and thereby moves each of the nozzles 90 relative to the nozzle-defect sensor, provides the defect-detect nozzle moving device as the defect-detect moving device.

A defect of each of the sixteen suction nozzles 90 may be detected by a so-called "line sensor" 460 as a sort of image detecting device, as shown in FIG. 18. The line sensor 460 includes a number of CCDs (charge-coupled devices) as light detecting elements that are arranged along a line such as a straight line. The CCDs generate respective electric signals corresponding to respective amounts of light received thereby. Based on the electric signals, the control device 330 obtains image data representing an image of the suction pipe 134 of the each nozzle 90. The line sensor 460 is provided at a position which corresponds to the nozzle-defect-detect position as one of the sixteen stop positions of the each nozzle 90 and which is somewhat away from the path of revolution of each pipe 134. The line sensor 460 extends in a direction perpendicular to the axis line of each pipe 134 stopped at the nozzle-defect-detect position.

When each of the suction nozzles 90 is stopped at the nozzle-defect-detect position, the suction pipe 134 of the each nozzle 90 is lighted by a lighting device (not shown), and the light reflected by the pipe 134 is incident to the line sensor 460, so that an image of a portion of the pipe 134 is formed on the line sensor 460. The line sensor 460 is connected to the control device 330 which controls the present EC mounting apparatus, and outputs and supplies the electric signals or image data to the control device 330. Based on the image data, the control device 330 judges whether the each nozzle 90 has a defect, i.e., a defective nozzle.

In the case where the suction pipe 134 is straight as indicated at solid line in FIG. 18, the image of the pipe 134 is formed at an expected position. However, in the case where the suction pipe 134 is curved as indicated at two-dot chain line in FIG. 18, the image of the pipe 134 is formed at a position deviated from the expected position. Thus, the control device 330 can identify that the pipe 134 is curved. Although the size of image of each suction pipe 134 changes depending upon the diameter of the each pipe 134, the control device 330 can identify, irrespective of the diameter of the each pipe 134, whether the each pipe 134 is curved, by judging whether the image of the each pipe 134 is formed at a position deviated from the expected position. The control device 330 can detect breaking of the each pipe 134, because no image of the each pipe 134 is formed on the line sensor 460. A portion of the control device 330 that judges, based on the electric signals (i.e., image data) supplied from the line sensor 460, whether the each nozzle 90 has a defect, i.e., a defective nozzle, provides an image processing device.

Curving of each suction nozzle 90 may be detected by moving the each nozzle 90 and a line sensor (not shown) in a direction parallel to the axis line of the each nozzle 90. For example, the line sensor is provided at the EC-suck-and-mount position such that the line sensor extends in a direction perpendicular to the axis line of the nozzle 90 stopped at that position. While the nozzle 90 is lowered and elevated at the position by the elevating and lowering device 170, an image of the suction pipe 134 of the nozzle 90 is taken by the line sensor and, based on the taken image, a defect of the nozzle 90 is detected. If the pipe 134 is straight, the position where the image of the pipe 134 is formed on the line sensor does not change as the pipe 134 moves; and if the pipe 134 is curved, that position changes. Thus, the control device 330 can identify that the pipe 134 is curved. Based on the change of the position, the control device 330 can know how the pipe 134 as a whole is curved, i.e., the direction in which the pipe 134 is curved and the amount of curving of the pipe 134 in the direction. It is possible that a similar elevating and lowering device be provided at a position different from the EC-suck-and-mount position and each suction nozzle 90 be elevated and lowered relative to a line sensor by the elevating and lowering device. In either case, the elevating and lowering device provides the defect-detect nozzle moving device as the defect-detect moving device.

The image taking device which provides the nozzle-defect detecting device may be provided by a surface-image taking device 470 which takes a surface image of the suction pipe 134 of each suction nozzle 90, as shown in FIGS. 19, 20A, 20B, 20C, and 20D. The surface-image taking device 470 is provided at the nozzle-defect-detect position as one of the sixteen stop positions of the each nozzle 90, and includes a matrix of CCDs as solid-state image sensors or light detecting elements that are arranged on a common plane. The matrix of CCDs defines an image-take surface 472, and generates respective electric signals corresponding to respective amounts of light received by the individual CCDs. Based on the electric signals supplied from the CCDs, the control device 330 of the present EC mounting apparatus obtains image data representing a surface image of the each pipe 134 formed on the image-take surface 472. The surface-image taking device 470 is opposed to the pipe 134 of the nozzle 90 stopped at the nozzle-defect-detect position, such that the image-take surface 472 thereof extends on a plane perpendicular to the axis line of the pipe 134. The control device 330 processes the electric signals (i.e., image data) supplied from the surface-image taking device 470.

When each suction nozzle 90 is stopped at the nozzle-defect-detect position, the suction pipe 134 of the each nozzle 90 is lighted by a lighting device (not shown), and the light reflected by a suction surface 474 of the pipe 134 at which the pipe 134 sucks and holds an EC 92 is incident to the image-take surface 472 of the surface-image taking device 470, so that an image 476 of the suction surface 474 is formed on the image-take surface 472. If the pipe 134 is not curved and straight, the image 476 of the suction surface 474 is formed at the center of the image-take surface 472, as shown in FIG. 20A. If the pipe 134 is curved, the image 476 of the suction surface 474 is formed at a position deviated from the center of the image-take surface 472, as shown in FIG. 20B. Thus, the control device 330 can identify that the pipe 134 is curved. If the pipe 134 is worn, the amount of light reflected from the worn portion of the suction surface 474 is less than that from the intact portion of the same 474, and the image 476 of the suction surface 474 a portion of which is unclear is formed at the center of the image-take surface 472, as shown at shadow in FIG. 20C. Thus, the control device 330 can identify that the pipe 134 is worn. Moreover, if the pipe 134 is stained with dust or the like, an image other than the image 476 of the suction surface 474 is additionally formed on the image-take surface 472, as shown in FIG. 20D. Thus, the control device 330 can identify that the pipe 134 is stained. Furthermore, though not shown, if the pipe 134 is broken, the distance between the pipe 134 and the image-take surface 472 changes and accordingly an unclear image of the broken-end surface of the nozzle 134 is formed at the center of the image-take surface 472. Thus, the control device 330 can identify that the pipe 134 is broken.

Thus, the surface-image taking device 470 can detect curving and breaking of each suction pipe 134, irrespective of whether the diameter of the each pipe 134 is small or great. In addition, the taking device 470 can detect wearing and staining of the each pipe 134. A portion of the control device 330 that processes the electric signals or image data supplied from the taking device 470 and judges whether the each nozzle 90 has a defect, provides the image processing device.

A defect of each suction nozzle 90 may be detected by detecting at least one failure of the each nozzle 90 to suck and hold at least one EC 92, as will be described below by reference to a nozzle-defect detecting routine shown in FIG. 21.

A failure of the each nozzle 90 to suck and hold an EC 92 may be detected by, e.g., taking an image of the EC 92 held by the each nozzle 90. As described previously, at the EC-image-take position of the present EC mounting apparatus, the image taking device device 160 is provided to take an image of the EC 92 held by each of the sixteen suction nozzles 90. Based on the image data supplied from the image taking device 160, the control device 330 calculates the X-axis-direction and Y-axis-direction position errors and rotation-position error of the EC 92 held by the each nozzle 90. In addition, the control device 330 can identify, based on the image data, whether the each nozzle 90 holds an EC 92 or not and, if the each nozzle holds the EC 92, identify whether the each nozzle 90 holds the EC 92 in a posture thereof in which the EC 92 can be mounted on the PCB 32.

Figure 22:
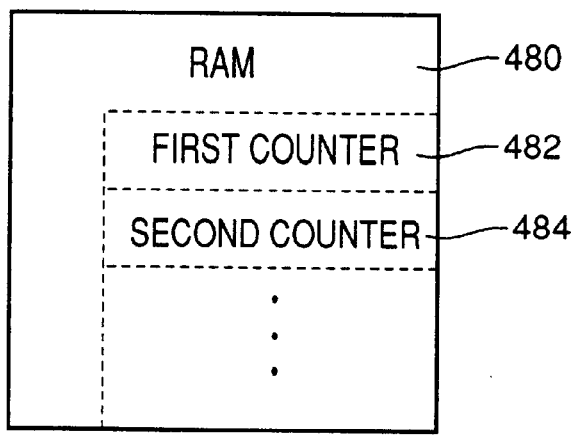
FIG. 22 is an illustrative view of a construction of a random access memory ("RAM") of the computer that is utilized to carry out the nozzle-defect detecting routine of FIG. 20.

The nozzle-defect detecting routine shown in FIG. 21 is stored in the ROM 334 of the computer 340 as the control device 330 of the present EC mounting apparatus. A defect of each of the suction nozzles 90 is detected by detecting a predetermined number, n (e.g., n=3), of failures of the each nozzle 90 to hold an EC 92, while the each nozzle 90 mounts a predetermined number, N (e.g., N=1,000), of ECs 92 on the PCB 32. The computer 340 has an additional RAM 480, shown in FIG. 22, which includes a first and a second counter 482, 484 in addition to a working memory. The nozzle-defect detecting routine is carried out for each one of the sixteen suction nozzles 90, and the current number of ECs 92 that have been mounted by the each nozzle 90 and the current number of EC-hold failures of the each nozzle 90 are stored in the first and second counters 482, 484, respectively. Thus, a defect of each one of the suction nozzles 90 is detected, and the first and second counters 482, 484 are provided for the each nozzle 90, though not shown.

At Step S21, the computer 340 judges whether it is now a time when each of the suction nozzles 90 should currently hold an EC 92, after the one nozzle 90 has taken an EC 92 at the EC-suck-and-mount position and before it mounts the EC 92 on the PCB 32. This judgement can be made based on the EC mounting program or routine according to which the present EC mounting apparatus mounts ECs 92 on PCBs 32. This judgment will be utilized for detecting a defect of the each nozzle 90 based on the presence or absence of an EC 92 with the each nozzle 90 and the posture of the EC 92 held by the same 90.

If a positive judgment is made at Step S21, the control goes to Step S22 to judge, based on the image data supplied from the image taking device 160, whether the each nozzle 90 appropriately holds an EC, that is, judge whether the each nozzle 90 holds an EC 92 or not and, if the each nozzle 90 holds an EC 92, whether the each nozzle 90 holds an EC 92 in an appropriate posture in which the EC 92 can be mounted on the PCB 32. If the each nozzle 90 holds an EC 92 which, however, takes an inappropriate posture, such as an upside-down posture or an upright posture, the EC 92 cannot be mounted on the PCB 32. Thus, this is counted as a failure of the each nozzle 90 to hold an EC 92. If a positive judgment is made at Step S22, the control goes to Step S23 to increment, by one, a number, $C_1$, counted by the first counter 482. Step S23 is followed by Step S24 to judge whether the number $C_1$ is equal to, or greater than, the predetermined number N (e.g., N=1,000). The first counter 482 counts the number of ECs 92 that have been mounted by the each nozzle 90. At an early stage, a negative judgment is made at Step S24. Thus, the current control cycle according to the routine of FIG. 21 is terminated.

If the each nozzle 90 does not currently hold an EC 92, or holds an EC 92 which, however, takes an appropriate posture, a negative judgment is made at Step S22. Then, the control goes to Step S26 to increment, by one, a number, $C_2$, counted by the second counter 484. Step S26 is followed by Step S27 to judge whether the number $C_2$ is equal to, or greater than, the predetermined number n (e.g., n=3). The second counter 484 counts the number of EC-hold hold failures of the each nozzle 90, and Step S27 is provided for judging whether the predetermined number (e.g., 3) of failures have occurred. If a negative judgment is made at Step S27, the current control cycle according to the routine of FIG. 21 is terminated.

If the each nozzle 90 mounts the predetermined number N of ECs 92 on the PCB 32 before the second mounter 484 counts up the predetermined number n of EC-hold failures of the each nozzle 90, a positive judgment is made at Step S24, and the control goes to Step S25 to reset each of the respective current numbers $C_1$, $C_2$ of the first and second counters 482, 484, to zero. If the limit or control number N is not employed, the second mounter 484 may count up the predetermined number n of EC-hold failures of the each nozzle 90, though, in fact, the each nozzle 90 does not have any defects. Hence, the control number N is employed, and a defect of the each nozzle 90 is detected by counting the failure number n relative to the control number N.

On the other hand, if the second mounter 484 counts up the predetermined number n of EC-hold failures of the each nozzle 90 before the each nozzle 90 mounts the predetermined number N of ECs 92 on the PCB 32, a positive judgment is made at Step S27, and the control goes to Step S28 to reset each of the respective current numbers $C_1$, $C_2$ of the first and second counters 482, 484, to zero. Then, the control goes to Step S29 to command the each nozzle 90 to discard the EC 92 and command an automatic exchange of the each nozzle 90, i.e., the defective nozzle 90 with a normal one 90. In the present embodiment, the image taking device 160 provides a failure detecting device; and a portion of the control device 330 that carries out Steps S21 to S28 cooperates with the RAM 380 to provide a statistic-analysis device as a judging device.

Figure 23:
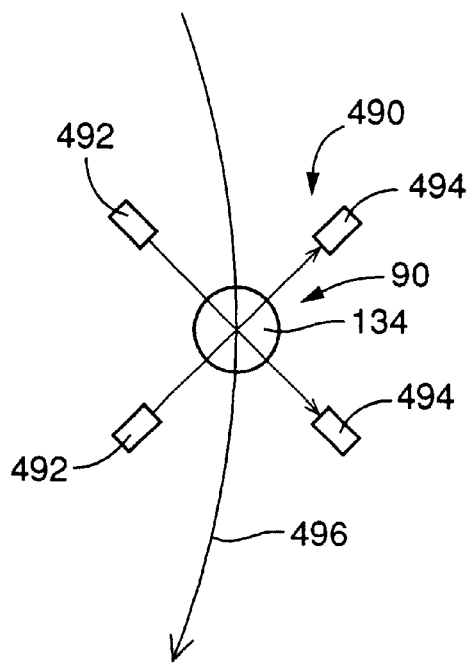
FIG. 23 is a view for explaining an operation of a nozzle-defect detecting device of another EC mounting apparatus as a sixth embodiment of the present invention.

Moreover, a defect of each suction nozzle 90 may be detected, without needing to rotate the each nozzle 90 about its axis line, by a nozzle-defect detecting device 490 as shown in FIG. 23. In the particular example shown in FIG. 23, the nozzle-defect detecting device 490 is provided by a transmission-type photoelectric sensor including plural (e.g., two) pairs of beam emitting and detecting devices 492, 494 each pair of which are opposed to each other via a path 496 of movement of the suction pipe 134 of the each nozzle 90, in a direction intersecting the axis line of the pipe 134 or nozzle 90. The direction in which the beam emitting and detecting devices (i.e., light emitter and receiver) 492, 494 of the first pair are opposed to each other is perpendicular to that in which the beam emitting and detecting devices 492, 494 of the second pair are opposed to each other, on a plane perpendicular to the axis line of the pipe 134. The optical axis of the beam emitting and detecting devices 492, 494 of each of the two pairs perpendicularly intersects the axis line of the pipe 134, and simultaneously the optical axis of the first pair of devices 492, 494 perpendicularly intersects that of the second pair of devices 492, 494.

Since the suction pipe 134 are observed in a plurality of radial directions about the axis line thereof, curving of the pipe 134 can be reliably detected without needing to change the current rotation position of the pipe 134. If the pipe 134 is not curved, the pipe 134 prevents each of the two beam detecting devices 494 from detecting the light emitted by a corresponding one of the two beam emitting devices 492. On the other hand, if the pipe 134 is curved, the curved pipe 134 does not prevent at least one of the two beam detecting devices 494 from detecting the light emitted by a corresponding one of the two beam emitting devices 492. Thus, even if the pipe 134 may be curved in a direction parallel to the optical axis of one pair of beam emitting and detecting devices 492, 494, the curved pipe 134 is not aligned with the optical axis of the other pair of devices 492, 494. Thus, the control device 330 can reliably identify that the pipe 134 is curved.

In the nozzle exchanging operation, the horizontal and vertical movements of each nozzle holder 152, the vertical movement of the nozzle storing plate 194, and the movement of the nozzle-removal inhibiting plate 280 may be concurrently performed in a range in which the suction nozzle 90 held by the each holder 152, the storing plate 194, and the inhibiting plate 280 do not interfere with one another. For example, when the nozzle 90 held by the holder 152 is returned to the storing plate 194, the downward movement of the holder 152 and the upward movement of the storing plate 194 may concurrently occur. In addition, after the holder 152 is moved downward and the tapered hole 138 of the holder 152 fits on the tapered portion 136 of one suction nozzle 90 stored in the storing plate 194, the upward movement of the holder 152, the rotation of the IR body 68, and the horizontal movement of the X-Y robot 60, 62 may concurrently occur. In the last case, the downward movement of the storing plate 194 may additionally occur concurrently with the respective movements of the holder 152, the IR body 68, and the robot 60, 62.

In each of the illustrated embodiments, each nozzle holder 152 and the nozzle storing plate 194 (or the storing-plate supporting member 204) exchange the respective suction nozzles 90 held thereby, with each other, by utilizing both the vertical movement of the each holder 152 and the vertical movement of the storing plate 194. However, the suction nozzles 90 can be exchanged with each other, by utilizing only the vertical movement of the each holder 152, without needing the vertical movement of the storing plate 194.

In each of the illustrated embodiments, the nozzle-exchange sensor 390 is provided together with the nozzle holders 152 on the X-Y slide 54, and is used to identify whether each nozzle holder 152 has returned one suction nozzle 90 held thereby, to the nozzle storing plate 194, and received another nozzle 90 from the storing plate 194, by identifying whether the each holder 152 actually holds the new nozzle 90, while the each holder 152 is moved by the X-Y robot 62, 64. However, the nozzle-presence sensor 392 that is used to identify whether a suction nozzle 90 is present in, or absent from, each nozzle storing hole 250 of the storing plate 194 may be also used to identify whether each nozzle holder 152 has exchanged two nozzles 90 with the storing member 194. If the each holder 152 is operated to return one nozzle 90 to the storing plate 194 and then the sensor 392 detects the one nozzle 90 on the plate 194, the control device 330 can judge that the each holder 152 has returned the one nozzle 90 to the plate 194; and if the each holder 152 is operated to take another nozzle 90 from the storing plate 194 and then the sensor 392 does not detect the another nozzle 90 on the plate 194, the control device 330 can judge that the each holder 152 has taken the another nozzle 90 and holds the same 90.

The principle of the present invention is applicable to not only the EC mounting apparatus 20, 22 as described above but also any sort of EC mounting apparatus including a rotatable body which is rotatable about an axis line and a plurality of suction nozzles which are supported by the rotatable body and which sequentially suck ECs, while the rotatable body is rotated, transfer the ECs, and mount the ECs on a CS. For example, the present invention is applicable to the EC mounting apparatus disclosed in Japanese Patent Application laid open under Publication No. 6-342, 998. The disclosed apparatus includes a rotatable body which is rotatable about an axis line, and a plurality of EC suction units which are supported by the rotatable body such that the EC suction units are provided along a circle whose center rides on the axis line and which are sequentially stopped at an EC-suck position where each suction unit sucks an EC and at an EC-mount position where the each suction unit mounts the EC. Each of the EC suction units is provided with a plurality of suction nozzles each of which is selectively used to suck and mount an EC. Thus, an appropriate one of the suction nozzles of each one of the suction units can be selected and used with an appropriate one selected from the suction nozzles of each of the other suction units, so that the EC mounting apparatus can use an appropriate combination of respective suction nozzles selected from the suction units, to suck and mount ECs. In this case, if one of the suction nozzles that has been selected from one suction unit becomes defective, the same sort of suction nozzle as that of the defective nozzle can be re-selected from another suction unit, so that the EC mounting apparatus can continue the current EC mounting operation. In this case, however, the defective nozzle is not used to suck and mount ECs and accordingly the total number of nozzles that can be used to suck and mount ECs decreases, which leads to decreasing the EC mounting efficiency. In contrast, according to the present invention, when a defect of each of the suction nozzles is detected, the current EC mounting operation is suspended and the defective nozzle is exchanged with a normal one. After the nozzle exchange, the EC mounting apparatus can use all the prescribed number of suction nozzles to suck and mount ECs, which leads to avoiding the decrease of the EC mounting efficiency that would otherwise result from letting the defective nozzle remain of no use.

It is to be understood that the present invention may be embodied with not only the various features recited in SUMMARY OF THE INVENTION, but also various changes, improvements, and modifications that may occur to one having ordinary skill in the art without departing from the scope and spirit of the invention defined in the appended claims.

What is claimed is:

1. An apparatus for moving at least one operative suction nozzle which is operative to hold, by suction, at least one electric component, and mounting, on a circuit substrate, said at least one electric component held by said at least one operative suction nozzle, the apparatus comprising:
   a supplying device which supplies said at least one electric component to said at least one operative suction nozzle;
   a supporting device which supports the circuit substrate;
   a nozzle storing device which stores at least one normal suction nozzle;
   a nozzle moving device which moves said at least one operative suction nozzle to an arbitrary position on a plane parallel to the circuit substrate supported by the supporting device, wherein the nozzle moving device moves said at least one operative suction nozzle to the supplying device so that said at least one operative suction nozzle receives said at least one electric component from the supplying device, and moves said at least one operative suction nozzle holding said at least one electric component to the supporting device so that said at least one operative suction nozzle mounts said at least one electric component on the circuit substrate supported by the supporting device;
   a nozzle-defect detecting device which detects a defect of said at least one operative suction nozzle; and
   a nozzle exchanging device which automatically operates the nozzle moving device to move a defective suction nozzle having the detected defect, to the nozzle storing device so that the defective suction nozzle is exchanged with said at least one normal suction nozzle stored by the nozzle storing device.

2. The apparatus according to claim 1, further comprising a nozzle-exchanging-device control device which controls, when the nozzle-defect detecting device detects the defective suction nozzle, the nozzle exchanging device to exchange the defective suction nozzle with said at least one normal suction nozzle, while suspending an electric-component mounting operation which is continuously performed when the nozzle-defect detecting device does not detect the defective suction nozzle.

3. The apparatus according to claim 2, for mounting a plurality of electric components on the circuit substrate, wherein the nozzle-exchanging device control device controls the nozzle exchanging device to exchange the defective suction nozzle with said at least one normal suction nozzle, while suspending the electric-component mounting operation in which the electric components are mounted on the circuit substrate.

4. The apparatus according to claim 1, for mounting a plurality of electric components on the circuit substrate, wherein at least one of the nozzle-defect detecting device and the nozzle exchanging device is operated in an electric-component mounting operation in which the electric components are mounted on the circuit substrate.

5. The apparatus according to claim 1, wherein the nozzle storing device stores a plurality of normal suction nozzles such that each one of the normal suction nozzles is removable therefrom independent of the other normal suction nozzles, wherein the nozzle exchanging device comprises a nozzle-exchange moving device which performs a nozzle-exchange movement including a combination of a first relative movement of said each normal suction nozzle and the nozzle storing device in a direction parallel to an axis line of said each normal suction nozzle and a second relative movement of said each normal suction nozzle and the nozzle storing device in a direction perpendicular to the axis line.

6. The apparatus according to claim 5, wherein the nozzle exchanging device further comprises:
   a nozzle holder which holds said at least one operative suction nozzle in a state in which the nozzle holder permits said at least one operative suction nozzle to be removed therefrom when being drawn with a force having a direction toward a free end thereof and a magnitude greater than a reference value; and
   a permitting and inhibiting device which is supported by the nozzle storing device and which is selectively placed in (a) a permitting state in which the permitting and inhibiting device permits said at least one operative suction nozzle held by the nozzle holder to be stored by the nozzle storing device by being moved in one of opposite directions parallel to an axis line of said at least one operative suction nozzle and permits each of the normal suction nozzles stored by the nozzle storing device to be removed from the nozzle storing device by being moved in the other direction, and (b) an inhibiting state in which the permitting and inhibiting device inhibits said at least one operative suction nozzle held by the nozzle holder from being stored by the nozzle storing device by being moved in said one direction and inhibits said each normal suction nozzle stored by the nozzle storing device from being removed from the nozzle storing device by being moved in said other direction.

7. The apparatus according to claim 6, wherein each of said at least one operative suction nozzle held by the nozzle holder and the normal suction nozzles stored by the nozzle storing device includes a holdable portion which can be held by the nozzle holder, and a shoulder surface facing toward a side of the holdable portion, and wherein the nozzle storing device comprises a nozzle storing member and the permitting and inhibiting device comprises a nozzle-removal inhibiting member and a nozzle-removal-inhibiting member moving device, the nozzle storing member having a plurality of nozzle storing holes which are formed along a reference plane and each of which can accommodate a free-end-side portion of said each suction nozzle that is located between a free end thereof and the shoulder surface thereof, the nozzle-removal inhibiting member being movable along the reference plane, and having (a) a plurality of through-holes which correspond to the plurality of nozzle storing holes of the nozzle storing member, respectively, and each of which permits said free-end-side portion of said each suction nozzle to be passed therethrough in said opposite directions parallel to the axis line of said each suction nozzle, and (b) a plurality of nozzle-removal inhibiting portions which are adjacent to the plurality of through-holes, respectively, and each of which can engage the shoulder surface of said each suction nozzle to prevent said each suction nozzle from being removed from the nozzle storing member, the nozzle-removal-inhibiting-member moving device moving the nozzle-removal inhibiting member to an operative position thereof where each of the nozzle-removal inhibiting portions can engage the shoulder surface of said each suction nozzle and to an inoperative position thereof where the plurality of through-holes are aligned with the plurality of nozzle storing holes, respectively.

8. The apparatus according to claim 1, further comprising a nozzle presence detector which identifies whether said at least one normal suction nozzle is stored by the nozzle storing device.

9. The apparatus according to claim 8, further comprising an informing device which informs, when the nozzle presence detector identifies that said at least one normal suction nozzle is not stored by the nozzle storing device, an operator of a fact that said at least one normal suction nozzle is not stored by the nozzle storing device.

10. The apparatus according to claim 1, wherein the nozzle defect detecting device detects the defect of said at least one operative suction nozzle holding said at least one electric component.

11. The apparatus according to claim 10, wherein when the nozzle defect detecting device detects the defect of said at least one operative suction nozzle holding said at least one electric component, the nozzle exchanging device first operates the nozzle moving device to move the defective suction nozzle having the detected defect, to a predetermined position where the defective suction nozzle discards said at least one electric component, and then operates the nozzle moving device to move the defective suction nozzle to the nozzle storing device so that the defective suction nozzle is exchanged with said at least one normal suction nozzle stored by the nozzle storing device.

12. The apparatus according to claim 1, further comprising a nozzle exchange detector which identifies whether the defective suction nozzle is stored by the nozzle storing device.

13. An apparatus for moving a plurality of operative suction nozzles which are operative to hold, by suction, respective electric components, and mounting, on a circuit substrate, the respective electric components held by the operative suction nozzles, the apparatus comprising:
- a movable member to which each of the operative suction nozzles is detachably attached;
- a supplying device that supplies the respective electric components to the operative suction nozzles attached to the movable member;
- a supporting device which supports the circuit substrate;
- a nozzle storing device which stores at least one normal suction nozzle;
- a nozzle moving device which moves the movable member to which the operative suction nozzles are attached, to an arbitrary position on a plane parallel to the circuit substrate supported by the supporting device, wherein the nozzle moving device moves the movable member to the supplying device so that the operative suction nozzles attached to the movable member receive the respective electric components from the supplying device, and moves the movable member to the supporting device so that the operative suction nozzles attached to the movable member mount the respective electric components on the circuit substrate supported by the supporting device;
- a nozzle-defect detecting device which detects a defect of said each of the operative suction nozzles; and
- a nozzle exchanging device which automatically operates the nozzle moving device to move the movable member to the nozzle storing device, so that the defective suction nozzle attached to the movable member is exchanged with said at least one normal suction nozzle stored by the nozzle storing device.

14. The apparatus according to claim 13, wherein the nozzle exchanging device automatically operates the nozzle moving device to move the movable member to the nozzle storing device, so that the defective suction nozzle attached to the movable member is detached from the movable member and is stored by the nozzle storing device, and said at least one normal suction nozzle stored by the nozzle storing device is attached to the movable member.

15. The apparatus according to claim 13, further comprising a nozzle presence detector which identifies whether said at least one normal suction nozzle is stored by the nozzle storing device, wherein the movable member supports the nozzle presence detector.

16. The apparatus according to claim 13, further comprising a nozzle exchange detector which identifies whether the defective suction nozzle is stored by the nozzle storing device, wherein the movable member supports the nozzle exchange detector.

17. A method of moving at least one nozzle holder holding at least one suction nozzle holding, by suction, at least one electric component, and mounting, on a circuit substrate, said one electric component held by said at least one suction nozzle, the method comprising the steps of:
- detecting a flaw of said at least one suction nozzle held by said at least one nozzle holder; and
- operating a controller to automatically exchange said at least one suction nozzle having the detected flaw, with a normal suction nozzle, by moving, with a moving device, said at least one nozzle holder holding said at least one suction nozzle having the detected flaw, to a position where said at least one nozzle holder releases said at least one suction nozzle having the detected flaw, so that at said position said at least one nozzle holder releases said at least one suction nozzle having the detected flaw, and then causing said at least one nozzle holder to hold the normal suction nozzle.

18. The method according to claim 17, wherein the step of detecting the flaw of said at least one suction nozzle comprises detecting the flaw of said at least one suction nozzle based on a light which has been affected by a free end surface of said at least one suction nozzle and has been transmitted in a direction parallel to an axis line of said at least one suction nozzle.

19. The method according to claim 17, wherein the step of detecting the flaw of said at least one suction nozzle comprises detecting the flaw comprising at least one of breaking, curving, staining, and wearing of said at least one suction nozzle.

20. A method of moving at least one suction nozzle holding, by suction, at least one electric component, and mounting, on a circuit substrate, said at least one electric component held by said at least one suction nozzle, the method comprising the steps of:

detecting a defect of said at least one suction nozzle when said at least one suction nozzle is expected to have held said at least one electric component; and automatically exchanging, upon detection of the defect, the defective suction nozzle having the detected defect, with a normal suction nozzle, wherein the step of automatically exchanging the defective suction nozzle comprises discarding said at least one electric component held by the defective suction nozzle, and subsequently exchanging the defective suction nozzle with the normal suction nozzle.

21. The method according to claim 20, wherein the step of detecting the defect of said at least one suction nozzle comprises detecting the defect including at least one of breaking and curving of said at least one suction nozzle.

22. The method according to claim 20, wherein the step of detecting the defect of said at least one suction nozzle comprises detecting the defect of said at least one suction nozzle based on a light which has been affected by a side surface of said at least one suction nozzle and has been transmitted in a direction intersecting an axis line of said at least one suction nozzle.

23. The method according to claims 20, wherein the step of detecting the defect of said at least one suction nozzle comprises detecting, with a nozzle defect detecting device, the defect of said at least one suction nozzle.

24. The method according to claim 20, wherein the step of automatically exchanging the defective suction nozzle comprises automatically exchanging the defective suction nozzle with a normal suction nozzle of a same sort as a sort of the defective suction nozzle.

25. An apparatus for moving at least one nozzle holder holding at least one operative suction nozzle which is operative to hold, by suction, at least one electric component, and mounting, on a circuit substrate, said at least one electric component held by said at least one operative suction nozzle, the apparatus comprising:

a supplying device which supplies said at least one electric component to said at least one operative suction nozzle;

a supporting device which supports the circuit substrate;

a moving device which moves said at least one nozzle holder holding said at least one operative suction nozzle to an arbitrary position on a plane parallel to the circuit substrate supported by the supporting device, wherein the moving device moves said at least one nozzle holder holding said at least one operative suction nozzle to the supplying device so that said at least one operative suction nozzle receives said at least one electric component from the supplying device, and moves said at least one nozzle holder holding said at least one operative suction nozzle holding said at least one electric component, to the supporting device so that said at least one operative suction nozzle mounts said at least one electric component on the circuit substrate supported by the supporting device;

a nozzle-defect detecting device which detects a defect of said at least one operative suction nozzle held by said at least one nozzle holder; and a controller which automatically operates the moving device to move said at least one nozzle holder holding the defective suction nozzle having the detected defect, to a position where said at least one nozzle holder releases the defective suction nozzle, so that at said position said at least one nozzle holder releases the defective suction nozzle, and which then causes said at least one nozzle holder to hold a normal suction nozzle.

26. The apparatus according to claim 25, further comprising a judging device which judges, when the nozzle-defect detecting device detects the defective suction nozzle, whether it is needed to exchange the defective suction nozzle with said at least one normal suction nozzle to prevent the defective suction nozzle from holding, by suction, any other electric component.

27. The apparatus according to claim 25, further comprising a movable member which supports a plurality of operative suction nozzles which hold, by suction, respective electric components, so that when the movable member is moved, the electric components held by the operative suction nozzles are simultaneously transferred with the movable member.

28. The apparatus according to claim 27, wherein the movable member comprises a rotatable member which is rotatable about an axis line and which supports the operative suction nozzles around the axis line, and wherein the rotatable member is moved, and then is rotated to sequentially position each of the operative suction nozzles at a component-mount position where said each operative suction nozzle mounts, on the circuit substrate, the electric component held thereby.

29. The apparatus according to claim 25, wherein the nozzle-defect detecting device comprises:

an image taking device which takes an image of at least a portion of said at least one operative suction nozzle; and an image processing device which processes image data representing the image taken by the image taking device, and judges whether said at least one operative suction nozzle has the defect.

30. The apparatus according to claim 29, wherein the nozzle-defect detecting device further comprises a defect-detect moving device which moves at least one of said at least one operative suction nozzle and the image taking device relative to the other of said at least one operative suction nozzle and the image taking device.

31. The apparatus according to claim 30, wherein the defect-detect moving device comprises a nozzle moving device which moves said at least one operative suction nozzle in a direction having at least one of a first direction component intersecting an axis line of said at least one operative suction nozzle and a second direction component parallel to the axis line.

32. The apparatus according to claim 30, wherein the defect-detect moving device comprises a nozzle rotating device which rotates said at least one operative suction nozzle about an axis line thereof.

33. The apparatus according to claim 25, wherein the nozzle-defect detecting device comprises:

a beam emitting device which emits a light beam in a direction intersecting an axis line of said at least one operative suction nozzle; and a beam detecting device which detects the light beam which has been emitted by the beam emitting device and has been affected by said at least one operative suction nozzle.

34. The apparatus according to claim 33, wherein the nozzle-defect detecting device further comprises a defect-detect moving device which moves at least one of said at least one operative suction nozzle and a combination of the beam emitting device and the beam detecting device to the other of said at least one operative suction nozzle and the combination.

35. The apparatus according to claim 25, wherein the nozzle-defect detecting device comprises:

a failure detecting device which detects a failure of said at least one operative suction nozzle to hold, by suction, said at least one electric component; and a judging device which judges, based on the detected failure, whether said at least one operative suction nozzle has the defect.

36. The apparatus according to claim 35, wherein the judging device comprises a statistic-analysis device which statistically analyzes a plurality of failures detected by the failure detecting device, and judges, based on the statistic analysis of the statistic-analysis device, whether said at least one operative suction nozzle has the defect.

* * * * *